(12) United States Patent
Shirota et al.

(10) Patent No.: US 10,438,665 B2
(45) Date of Patent: Oct. 8, 2019

(54) MEMORY DEVICE AND INFORMATION PROCESSING SYSTEM

(71) Applicant: Toshiba Memory Corporation, Minato-ku (JP)

(72) Inventors: Yusuke Shirota, Yokohama (JP); Tatsunori Kanai, Yokohama (JP); Satoshi Shirai, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/695,563

(22) Filed: Sep. 5, 2017

(65) Prior Publication Data

US 2018/0277224 A1    Sep. 27, 2018

(30) Foreign Application Priority Data

Mar. 21, 2017 (JP) ................. 2017-054762

(51) Int. Cl.
| | |
|---|---|
| *G11C 16/10* | (2006.01) |
| *G06F 12/06* | (2006.01) |
| *G06F 13/16* | (2006.01) |
| *G11C 7/00* | (2006.01) |
| *G11C 5/14* | (2006.01) |
| *G11C 7/10* | (2006.01) |
| *G06F 15/167* | (2006.01) |

(52) U.S. Cl.
CPC ........ *G11C 16/107* (2013.01); *G06F 12/0646* (2013.01); *G06F 13/1663* (2013.01); *G06F 15/167* (2013.01); *G11C 5/148* (2013.01); *G11C 7/00* (2013.01); *G11C 7/1048* (2013.01)

(58) Field of Classification Search
CPC ......... G11C 16/107; G11C 5/148; G11C 7/00; G11C 7/1048

USPC ................................................ 365/230.03
See application file for complete search history.

(56) References Cited

U.S. PATENT DOCUMENTS

2010/0110748 A1\* 5/2010 Best .................... G06F 12/0638
                                                                      365/51
2013/0268728 A1\* 10/2013 Ramanujan ........ G11C 14/0045
                                                                      711/105

OTHER PUBLICATIONS

Geiger et al, Beyond Basic Region Caching: Specializing Cache Structures for High Performance and Energy Conservation, 2005, Springer-Verlag Berlin Heidelberg (Year: 2005).\*
R. F. Freitas, et al. "Storage-class Memory: The Next Storage System Technology", IBM Journal of Research and Development, vol. 52 No. 4, 2008, pp. 9.

\* cited by examiner

*Primary Examiner* — Tha-O H Bui
*Assistant Examiner* — Alfredo Bermudez Lozada
(74) *Attorney, Agent, or Firm* — Oblon, McClelland, Maier & Neustadt, L.L.P.

(57) ABSTRACT

According to one embodiment, a memory device is connected to one or more information processing devices. The memory device includes a shared memory and a memory controller. The memory controller is configured to analyze an access to the shared memory by the one or more information processing devices and decide on an access method for accessing the shared memory by the one or more information processing devices. The memory controller is configured to give an instruction indicating the decided access method to the one or more information processing devices.

12 Claims, 15 Drawing Sheets

| REGION | LOCALITY | INFORMATION PROCESSING DEVICE | ACCESS RATE |
|---|---|---|---|
| A0000 | HIGH | S0001 | HIGH |
| A0001 | LOW | S0001, S0010 | LOW |
| A0002 | LOW | S0010 | HIGH |
| A0003 | HIGH | S0010 | LOW |
| A0004 | LOW | S0001, S0002 | HIGH |

| REGION | ACCESS METHOD | USAGE CAPACITY | HIGH SPEED/ LOW SPEED | INFORMATION PROCESSING DEVICE |
|---|---|---|---|---|
| A0000 | FIRST ACCESS PROCESS | 1/5 | | S0001 |
| A0001 | SECOND ACCESS PROCESS | | LOW SPEED | S0001, S0010 |
| A0002 | SECOND ACCESS PROCESS | | HIGH SPEED | S0010 |
| A0003 | FIRST ACCESS PROCESS | 1/2 | | S0010 |
| A0004 | SECOND ACCESS PROCESS | | HIGH SPEED | S0001, S0002 |

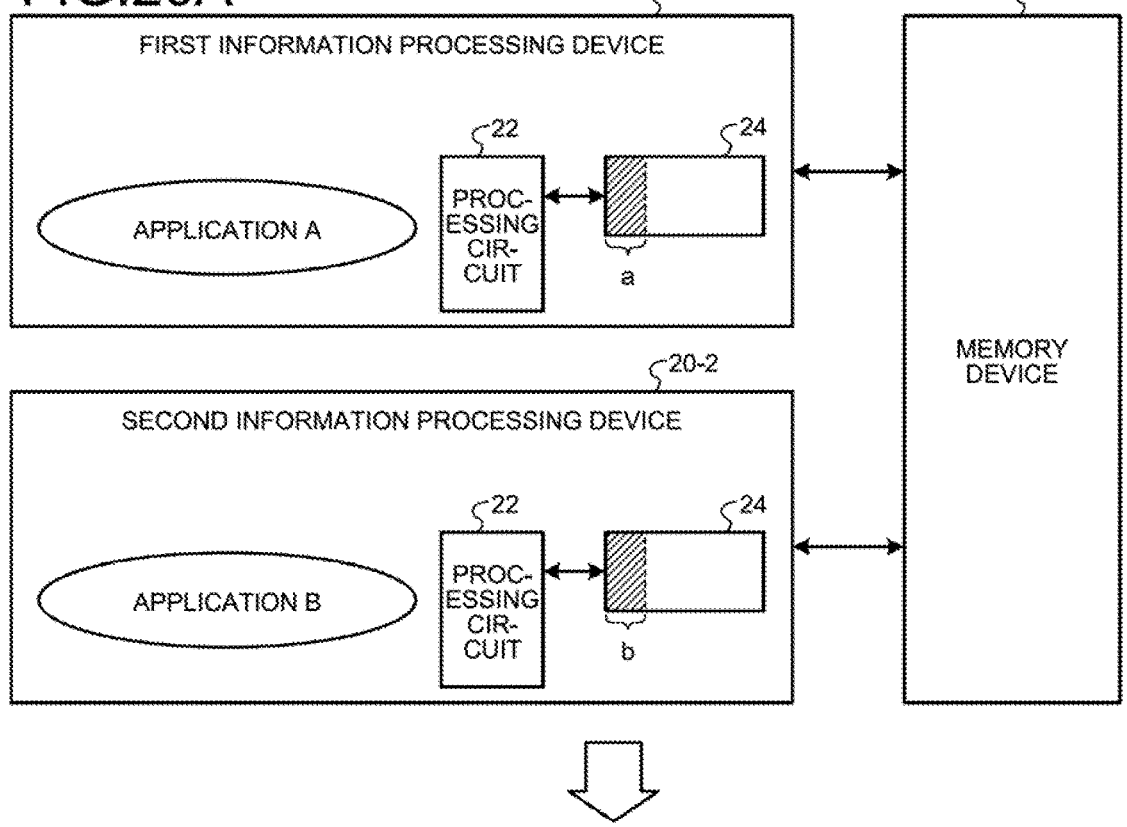
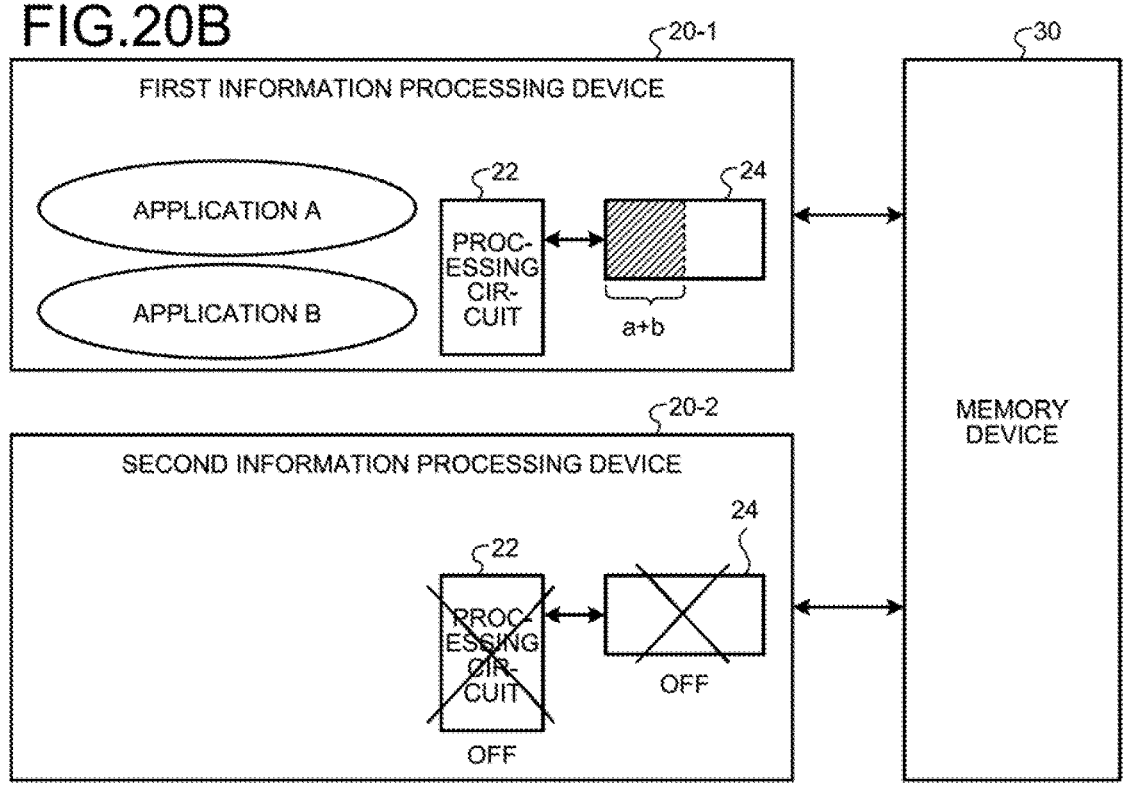

MEMORY DEVICE AND INFORMATION PROCESSING SYSTEM

CROSS-REFERENCE TO RELATED APPLICATIONS

This application is based upon and claims the benefit of priority from Japanese Patent Application No. 2017-054762, filed on Mar. 21, 2017; the entire contents of which are incorporated herein by reference.

FIELD

Embodiments described herein related generally to a memory device and an information processing system.

BACKGROUND

In recent years, computer systems execute large-scale data processing such as online real-time processing, big data processing, and deep learning processing. The computer systems necessarily use a huge-capacity main memory device when such processing is performed. However, in the past, information processing devices such as servers include a dynamic-random access memory (DRAM) having high standby power as a main memory device. For this reason, in the computer systems according to the related art, power consumption is high when the large-scale data processing is executed.

Further, in recent years, computer systems in which a plurality of servers are connected via a network such as Ethernet or InfiniBand to perform a distributed process have been known. In such computer systems, processing can be performed at a higher speed than when a server executes processing alone. However, in such computer systems, a large amount of data is transferred between the servers. For this reason, in the computer systems in which the distributed process is performed, when the large-scale data processing is executed, a processing speed is decreased.

BRIEF DESCRIPTION OF THE DRAWINGS

FIGS. 20A and 20B are diagrams illustrating an example of a process of an information processing system according to a sixth embodiment.

DETAILED DESCRIPTION

Figure 1:
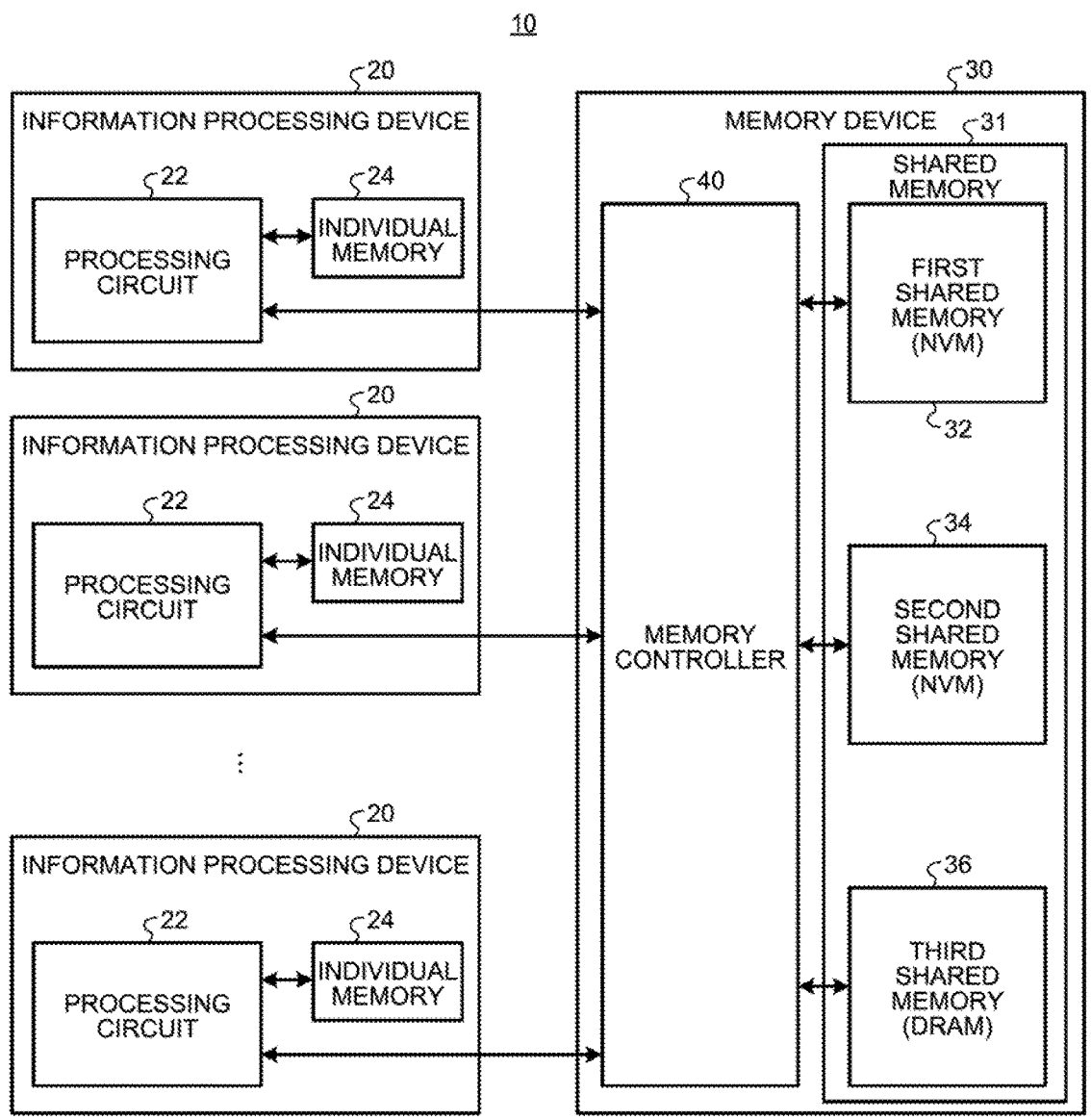
FIG. 1 is a diagram illustrating a configuration of an information processing system according to a first embodiment.

According to one embodiment, a memory device is connected to one or more information processing devices. The memory device includes a shared memory and a memory controller. The memory controller is configured to analyze an access to the shared memory by the one or more information processing devices and decide on an access method for accessing the shared memory by the one or more information processing devices and decide on an access configured to give an instruction indicating the decided access method to the one or more information processing devices.

Hereinafter, an information processing system 10 according to an embodiment will be described in detail with reference to the accompanying drawings. Hereinafter, a plurality of embodiments will be described, but blocks having substantially the same functions and configurations are denoted by the same reference numerals, and in second and subsequent embodiments, duplicate description will be omitted.

First Embodiment

FIG. 1 is a diagram illustrating a configuration of an information processing system 10 according to a first embodiment. The information processing system 10 includes a plurality of information processing devices 20 and a memory device 30.

Each of a plurality of information processing devices 20 is a computer that executes information processing independently. For example, plurality of information processing devices 20 executes individual operating systems. For example, a plurality of information processing devices 20 are accommodated in different housings or disposed on different substrates.

In this embodiment, the information processing system 10 including a plurality of information processing devices 20 is illustrated. However, the information processing system 10 may be configured to include one information processing device 20.

The memory device 30 is connected to each of a plurality of information processing devices 20. The memory device 30 functions as a main memory device common to a plurality of information processing devices 20. The memory device 30 receives an access request for writing data or reading data from each of a plurality of information processing devices 20. The memory device 30 internally stores the data in accordance with the received access request, and reads data stored therein and outputs the data to the information processing device 20. For example, the memory device 30 is accommodated in a different housing from that of a plurality of information processing devices 20 or disposed on a different substrate therefrom.

The information processing device 20 has a processing circuit 22 and an individual memory 24.

The processing circuit 22 includes one or more processors. The processor is, for example, a central processing unit (CPU). The processor may include one or more CPU cores. The processing circuit 22 executes a program and processes data. The processing circuit 22 may be any circuit as long as the processing circuit 22 can execute a program and perform a data process. For example, the processing circuit 22 may be a graphics processing unit (GPU) used in general-purpose computing on graphics processing unit (GPGPU). Further, the processing circuit 22 may be an accelerator such as a field programmable gate array (FPGA).

The processing circuit 22 reads data from the individual memory 24 or the memory device 30 or writes data in the individual memory 24 or the memory device 30 as the program is executed. For example, the processing circuit 22 has hierarchical caches such as an L1 data cache, an L1 instruction cache, an L2 cache, and an L3 cache. The processing circuit 22 temporarily stores data using the caches. For example, when a cache miss occurs in the lowest cache (the last level cache) in the hierarchical caches, the processing circuit 22 accesses the individual memory 24 or the memory device 30 in units of cache lines, and reads or writes necessary data.

The individual memory 24 is a memory device used as a work area of the processing circuit 22. The individual memory 24 is a volatile memory in which stored data disappears when supply of electric power stopped such as a dynamic random access memory (DRAM) or the like. The individual memory 24 may be a non-volatile memory such as a magnetoresistive random access memory (MRAM) capable of performing high-speed access, similarly to a DRAM. Alternatively, the individual memory 24 may include both a volatile memory and a non-volatile memory. For example, the individual memory 24 is implemented as a memory module of DIMM connection.

The processing circuit 22 is able to execute a command for memory access such as a store command or a load command and access the individual memory 24 and the memory device 30. Further, the processing circuit 22 is able to access the individual memory 24 and the memory device 30 in units of small regions such as units of cache lines or units of bytes. The processing circuit 22 is connected to the individual memory 24 via a memory bus. Further, the processing circuit 22 is connected to the memory device 30 via a shared memory interface.

For example, the processing circuit 22 uses the memory device 30 and the individual memory 24 as a main memory device. Further, the processing circuit 22 may use the individual memory 24 as a cache memory of the memory device 30. In other words, the processing circuit 22 may use the individual memory 24 as a memory that temporarily stores data stored in the memory device 30.

The memory device 30 includes a shared memory 31 and a memory controller 40. The shared memory 31 includes a first shared memory 32, a second shared memory 34, and a third shared memory 36.

The first shared memory 32 and the second shared memory 34 are large-capacity non-volatile memories (NVM) and are smaller in the standby power than the individual memory 24. For example, the standby powers of the first shared memory 32 and the second shared memory 34 are zero.

The second shared memory 34 has a faster response speed than the first shared memory 32 (that is, has smaller access latency). The second shared memory 34 may have a smaller storage capacity than the first shared memory 32.

Further, the first shared memory 32 and the second shared memory 34 may be slower in response speed than, for example, the individual memory 24. For example, the first shared memory 32 and the second shared memory 34 are memories having the access latency of about 10 nanoseconds to several microseconds.

The first shared memory 32 and the second shared memory 34 are able to perform writing or reading of data in data units similar to that of the individual memory 24. For example, the first shared memory 32 and the second shared memory 34 are able to perform writing or reading of data in units of small regions such as units of bytes.

Examples of each of the first shared memory 32 and the second shared memory 34 include an MRAM, a phase change memory (PCM), a phase random access memory (PRAM), a phase change random access memory (PCRAM), a resistance change random access memory (ReRAM), a ferroelectric random access memory (FeRAM), a 3DXPoint, and a Memristor. Each of the first shared memory 32 and the second shared memory 34 may be a memory called a storage class memory (SCM). The first shared memory 32 and the second shared memory 34 may be implemented by continuously applying electric power to a volatile memory which is extremely low in standby power and accessible in units of small regions such as units of bytes.

The third shared memory 36 is a volatile memory in which stored data disappears when the supply of electric power is stopped such as DRAM. The third shared memory 36 may be a non-volatile memory such as MRAM capable of performing high-speed access, similarly to a DRAM.

The third shared memory 36 has a faster response speed than the first shared memory 32 and the second shared memory 34. The third shared memory 36 may have a smaller storage capacity and a higher standby power than the first shared memory 32 and the second shared memory 34.

The shared memory 31 may be configured not to include the third shared memory 36. Further, the shared memory 31 may have a structure not including the second shared memory 34. Further, the memory device 30 may be configured to further include a non-volatile memory which is faster than the second shared memory 34 and accessible in units of small regions such as units of bytes.

The memory controller 40 receives an access request for accessing the shared memory 31 from the processing circuit 22 of each of a plurality of information processing devices 20. The memory controller 40 performs writing or reading of data on the first shared memory 32, the second shared memory 34, or the third shared memory 36 in response to the access request. Upon receiving a read request, the memory controller 40 transfers the data read from the first shared memory 32, the second shared memory 34, or the third shared memory 36 to the processing circuit 22 of the information processing device 20 that has transmitted the access request.

For example, the memory controller 40 causes the first shared memory 32, the second shared memory 34, and the third shared memory 36 to function as a mixed type main memory device of the processing circuit 22. Further, for example, the memory controller 40 may use the second shared memory 34 and the third shared memory 36 as a cache memory of the first shared memory 32. In other words, the memory controller 40 is able to cause the second shared memory 34 and the third shared memory 36 to function as a memory that temporarily stores the data stored in the first shared memory 32 for the purpose of high-speed access. The shared memory 31 is a main memory device in which three memories having different properties are mixed, and the main memory device includes a memory having a fast response speed and a memory having a slow response speed. The memory controller 40 appropriately moves data within the main memory device or reviews an arrangement of data in the main memory device for the purpose of high-speed access or the like. Accordingly, the memory controller 40 is able to store data in order to efficiently use the memories having different characteristics in the shared memory 31.

Here, a memory region of the shared memory 31 is divided into a plurality of logical regions. Further, access methods corresponding to a plurality of regions are set in the memory controller 40. Upon receiving the access request for accessing a certain region from the information processing device 20, the memory controller 40 accesses the region in accordance with the access method set for the region.

For example, a process of performing hierarchical access using the individual memory 24 as a cache memory, a process of directly accessing the first shared memory 32 as an access target, a process of directly accessing the second shared memory 34 as an access target, a process for directly accessing the third shared memory 36 as an access target, and the like are set in the memory controller 40 as the access methods. A specific example of the access method will be described later in detail.

In a case in which the access method is set, the memory controller 40 instructs a plurality of information processing devices 20 to set the access method for each of a plurality of regions. For example, the memory controller 40 gives an instruction indicating the access method for each of a plurality of regions to the information processing device 20 which is likely to access the region. Then, when the memory device 30 is accessed, the information processing device 20 executes writing or reading of data in accordance with the access method instructed for the region to be accessed. The shared memory interface connecting each of a plurality of information processing devices 20 with the memory device 30 has a function of transferring information indicating the access method from the memory controller 40 of the memory device 30 to each of a plurality of information processing devices 20.

Figure 2:
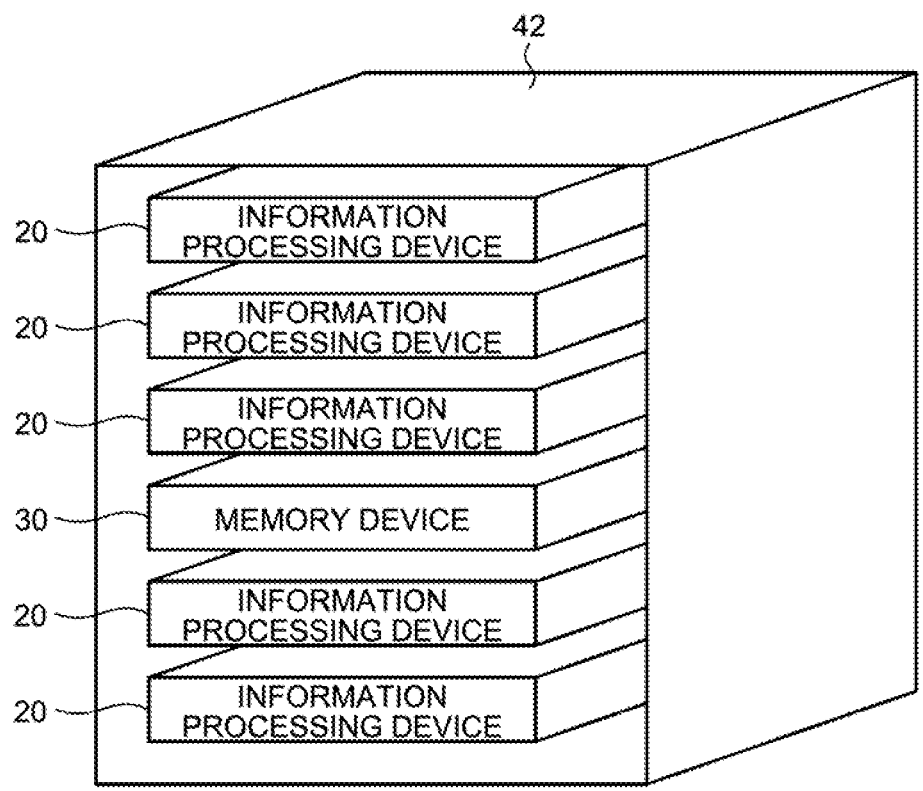
FIG. 2 is a diagram illustrating an example of an external configuration of the information processing system.

FIG. 2 is a diagram illustrating an example of an external configuration of the information processing system 10. The information processing system 10 may include, for example, a rack 42. The rack 42 accommodates a plurality of information processing devices 20 and the memory device 30. A plurality of information processing devices 20 are connected to the memory device 30 in the state in which the information processing devices are accommodated in the rack 42. The information processing system 10 is not limited to the configuration illustrated in FIG. 2 and may employ other configurations.

Figure 3:
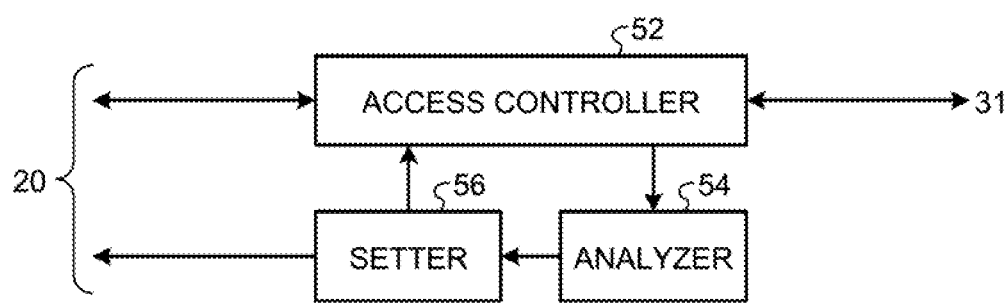
FIG. 3 is a diagram illustrating a configuration of a memory controller according to the first embodiment.

FIG. 3 is a diagram illustrating a configuration of the memory controller 40 according to the first embodiment. The memory controller 40 includes an access controller 52, an analyzer 54, and a setter 56.

The access controller 52 receives the access request for accessing the shared memory from each of a plurality of information processing devices 20. For example, the access controller 52 receives the write request or the read request for the shared memory 31 from each of a plurality of information processing devices 20. Then, the access controller 52 controls writing of data or reading of data on the shared memory 31 in accordance with the access request for accessing the shared memory 31 by a plurality of information processing devices 20.

The analyzer 54 analyzes the access to the shared memory 31 by a plurality of information processing devices 20. Specifically, for example, the analyzer 54 generates statistical information for the access and analyzes the statistical information. On the basis of the analysis result, the analyzer 54 decides on the access method for accessing the shared memory 31 by a plurality of information processing devices 30.

The setter 56 sets the access method decided by the analyzer 54 in the access controller 52. Further, the setter 56 gives an instruction indicating the decided access method to each of a plurality of information processing devices 20.

Further, the information processing device 20 accesses the shared memory 31 in accordance with the access method instructed from the setter 56. Specifically, each of a plurality of information processing devices 20 transmits the access request to the access controller 52 in accordance with the instructed access method. Upon receiving the access request for accessing the shared memory 31 from the information processing device 20, the access controller 52 performs writing of data and reading of data on the shared memory 31 in accordance with the access method set by the setter 56.

Here, the memory region of the shared memory 31 is logically divided into a plurality of regions. The analyzer 54 analyzes the access to each of a plurality of regions by a plurality of information processing devices 20 and decides on the access method for each of a plurality of regions. Then, the setter 56 sets the decided access method in the access controller 52 for each of a plurality of regions. Further, the setter 56 gives an instruction indicating the access method decided for each of a plurality of regions to a plurality of information processing devices 20.

The information processing device 20 accesses the shared memory 31 in accordance with the access method instructed for the region to be accessed. More specifically, the information processing device 20 transmits the access request to the access controller 52 in accordance with the access method instructed for the region to be accessed. Upon receiving the access request from the information processing device 20, the access controller 52 performs writing of data and reading of data on a corresponding region in accordance with the access method set for the region to be accessed.

For example, the analyzer 54 decides to set a first access process of performing writing or reading of data transferred from the shared memory 31 to the individual memory 24 as the access method for each of a plurality of regions or a second access process of directly performing writing or reading of the data stored in the shared memory 31. Then, the setter 56 sets either of the first access process and the second access process in the access controller 52 for each of a plurality of regions and gives an instruction indicating either of the first access process and the second access process to a plurality of information processing devices 20.

Then, when the region in which the first access process is instructed is accessed, each of a plurality of information processing devices 20 causes the access controller 52 to transfer data from the shared memory 31 to the individual memory 24 and performs writing or reading of the data transferred to the individual memory 24. Further, when the region in which by the second access process is instructed is accessed, each of a plurality of information processing devices 20 transmits a request for writing or reading the data stored in the shared memory 31 to the access controller 52. The first access process and the second access process will be further described in detail with reference to FIG. 4.

Further, when the access method is decided to be the first access process, the analyzer 54 may further determine the usage capacity of the individual memory 24. In this case, the setter 56 further gives an instruction indicating the decided usage capacity to a plurality of information processing devices 20. Then, each of a plurality of information processing devices 20 stores the data transferred from the shared memory 31 in the individual memory 24 within a range of the indicated usage capacity. The usage capacity in the individual memory 24 will be further described with reference to FIG. 7.

Further, when the access method is decided to be the first access process, the analyzer 54 may further decide on the saving method in the individual memory 24. In this case, the setter 56 further gives an instruction indicating the decided saving methods to a plurality of information processing devices 20. Then, when the data transferred from the shared memory 31 to the individual memory 24 exceeds the instructed usage capacity, each of a plurality of information processing devices 20 causes the data to be saved from the individual memory 24 to the shared memory 31 in accordance with an instructed saving method. The saving method in the individual memory 24 will be further described with reference to FIGS. 8, 9, and 10.

The shared memory 31 may include the first shared memory 32 and the second shared memory 34 having the response speed faster the first shared memory 32. In this case, the first shared memory 32 includes a plurality of physical memory regions corresponding to at least some of the plurality of logically divided regions in the shared memory 31. The analyzer 54 further decides whether the access method for the region in which the second access process is set is to be performed as a high-speed process or a low-speed process. Then, the setter further sets the high-speed process or the low-speed process in the access controller 52 for the region for which the second access process is decided.

Upon receiving the access request according to the second access process from the information processing device 20 for the region in which the low-speed process is set, the access controller 52 directly performs writing or reading of data on the corresponding region in the first shared memory 32. Further, when the high-speed process is set, the access controller 52 transfers the data of the corresponding region in the first shared memory 32 to the second shared memory 34 in advance. Then, upon receiving the access request according to the second access process from the information processing device 20 for the region in which the high-speed process is set, the access controller 52 directly performs writing or reading of the data which is transferred from the first shared memory 32 to the second shared memory in advance.

In a case in which the access is performed in accordance with the second access process, as the access latency increases, processing performance or the information processing device 20 decreases. Therefore, the access controller 52 is able to improve the processing performance of the information processing device 20 by transferring the data from the first shared memory 32 having a large access latency to the second shared memory 34 having a small access latency in advance. The high-speed process and the low-speed process will be further described with reference to FIG. 5.

Further, the analyzer 54 may further decide on a degree of parallelism indicating the number of processes to be executed in parallel as the access method for the region in which the second access process is set. Then, the setter 56 may give an instruction indicating the decided degree of parallelism to the information processing device 20 which makes an access request for accessing the region for which the second access process is decided.

Upon receiving the instruction indicating the degree of parallelism, the processing circuit 22 of the information processing device 20 executes a parallel process in accordance with the instructed degree of parallelism. For example, when an instruction indicating "1" is given as the degree of parallelism, the processing circuit 22 executes, for example, a process using one resource (one thread). Further, when an instruction indicating "2" is given as the degree of parallelism, the processing circuit 22 executes, for example, a parallel process using two resources (two threads). Further, when an instruction indicating "4" is given as the degree of parallelism, the processing circuit 22 executes, for example, a parallel process using four resources (four threads).

More specifically, for example, the processing circuit 22 changes the number of threads to be executed (the degree of parallelism) using a mechanism that causes one processor such as Hyper-Threading to function as a plurality of virtual processors. Further, the processing circuit 22 may change the number of threads (the degree of parallelism) by simultaneously executing different application programs. Further, the operating system operating on the information processing device 20 may change a switching speed in a context switch that switches contexts in accordance with the instructed degree of parallelism. For example, the operating system is able to switch the switching method of the context switch and may switch the switching method in accordance with the instructed degree of parallelism.

The analyzer 54 may decide on the degree of parallelism in accordance with the access latency of the region in which data is written through the second access process. In this case, the analyzer 54 decides on the degree of parallelism so that the degree of parallelism increases as the access latency increases. For example, the analyzer 54 decides on a degree of parallelism for the region in which data is written in the second shared memory 34 having a small access latency (fast response speed) as a first degree of parallelism (for example, the degree of parallelism=2). Further, the analyzer 54 calculates a degree of parallelism for the region in which data is written in the first shared memory 32 having a large access latency (slow response speed) as a second degree of parallelism higher than the first degree of parallelism (for example, the degree of parallelism=3).

In a case in which the degree of parallelism is increased, the access latency of the memory device 30 is large, although a process using a certain thread is delayed, the processing circuit 22 performs the process using other threads. Therefore, when the degree of parallelism is increased, although the process is executed using data stored in the region having the large access latency, the processing circuit 22 is able to execute the process at a high speed without stalling.

Further, when the analyzer 54 is able to acquire CPU usage rates of the processing circuits 22 of a plurality of information processing devises 20 in a form such as the number of stall cycles, the analyzer 54 may change the degree of parallelism in accordance with the acquired CPU usage rates. For example, in this case, the analyzer 54 increases the degree of parallelism for a region in which the CPU usage rate is low, and decreases the degree of parallelism for a region in which the CPU usage rate is high. When the CPU usage rate is high, the processing circuit 22 is unable to process at a high speed even though the degree of parallelism is increased. Therefore, by changing the degree of parallelism, the analyzer 54 is able to operate the processing circuit 22 efficiently.

Further, the analyzer 54 may decide to set the low-speed process or the high-speed process for the region for which the second access process and may also decide on the degree of parallelism. For example, the analyzer 54 decides to set the region decided as the high-speed process (that is, the region in which the data is written in or read from the second shared memory 34) to the first degree of parallelism. Further, the analyzer 54 decides to set the region decided as the low-speed process (that is, the region in which data is written in or read from the first shared memory 32) to the second degree of parallelism higher than the first degree of parallelism.

Accordingly, for the region decided as the high-speed process, since data is written in or read from the second shared memory 34 having a small access latency, the information processing device 20 is able to execute the process at a high speed. For the region decided as the low-speed process, the information processing device 20 executes the higher parallel process of degree of parallelism and thus can execute the process at a high speed. In the second access process, the access controller 52 executes the transfer process from the first shared memory 32 to the second shared memory 34, and thus the power consumption is high. Accordingly, when the analyzer 54 desirably executes the second access process at a high speed with low power consumption, the analyzer 54 may decide to set the low-speed process and set the high degree of parallelism.

Further, when the high-speed process is decided, the analyzer 54 may detect a sub region with a high possibility of access within the region decided as the high-speed process. In this case, the access controller 52 transfers data of the sub region to the second shared memory 34 in advance. In other words, the access controller 52 does not transfer the data to the second shared memory 34 for regions other than the sub region in the region decided as the high-speed process. The access controller 52 directly performs writing or reading of data previously transferred to the second shared memory 34 in accordance with the access request according to the second access process for the sub regions from each of a plurality of information processing devices 20. The access controller 52 directly performs writing or reading on the first shared memory 32 in accordance with the access request according to the second access process for the region different from the sub region from each of a plurality of information processing devices 20 in the region decided as the high-speed process.

Then, the setter 56 gives an instruction indicating the first degree of parallelism to the information processing device 20 that performs writing and reading of data on the sub region (that is, the information processing device 20 that performs writing or reading of data on the second shared memory 34). Further, the setter 56 gives an instruction indicating the second degrees of parallelism higher than the first degree of parallelism to the information processing device 20 that performs writing or reading of data on the region other than the sub region in the region decided as the high-speed process (that is, the information processing device 20 that performs writing and reading of data on the first shared memory 32). Accordingly, for the sub region, since data is written in or read from the second shared memory 34 having the smaller access latency, the information processing device 20 is able to execute the process at a high speed. For the region other than the sub region in the region decided as the high-speed process, the information processing device 20 executes the parallel process and thus can execute the process at a high speed.

Figure 4:
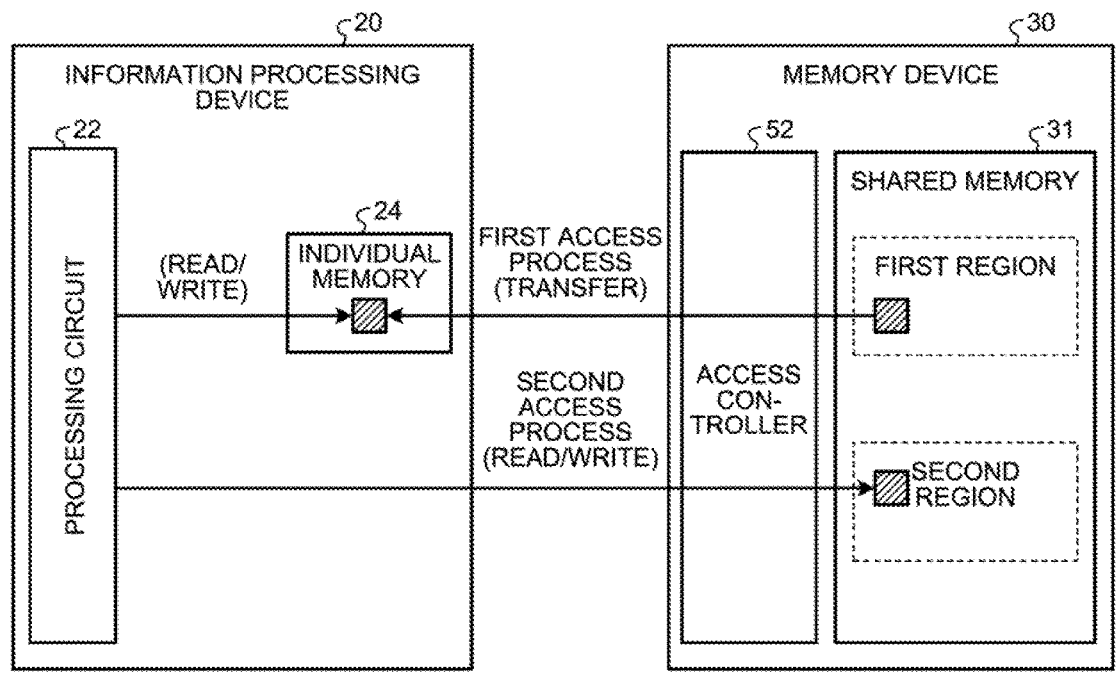
FIG. 4 is a diagram for describing a first access process and a second access process.

FIG. 4 is a diagram for describing the first access process and the second access process.

When writing or reading of data is performed on a first region in which the first access process is instructed as the access method, the processing circuit 22 of the information processing device 20 transmits the access request according to the first access process to the memory device 30.

Upon receiving the access request for accessing the first region in which the first access process is set from the information processing device 20, the access controller 52 of the memory device 30 reads a data block including target data (for example, a unit called a page) from the first shared memory 32 and transfers the read data block to the information processing device 20 that has transmitted the access request. Upon receiving the data block from the access controller 52, the processing circuit 22 stores the data block in the individual memory 24. Accordingly, the individual memory 24 is able to store a data block including data to be accessed in the first shared memory 32. For example, the processing circuit 22 performs writing or reading of the target data included in the data block transferred to the individual memory 24 in units of bytes.

Thereafter, when data is written in or read from the first region, the processing circuit 22 performs writing or reading of data on the individual memory 24. Further, when writing or reading of new target data not stored in the individual memory 24 is performed, the processing circuit 22 also transmits the access request according to the first access process to the memory device 30, and causes a data block including the new target data to be stored in the individual memory 24.

Further, in the first access process, in a case in which a new data block is unable to be transferred since an amount of data transferred to the individual memory 24 reaches a usage capacity which is instructed in advance, the processing circuit 22 stores an unnecessary data block stored in the individual memory 24 to be saved in the shared memory 31. Further, even when there is a data block determined to be unnecessary to be stored in the individual memory 24, the processing circuit 22 stores an unnecessary data block stored in the individual memory 24 to be saved in the shared memory 31.

As the first access process is executed as described above, the information processing device 20 is able to access data at a high speed. Accordingly, for example, when an application program that repeatedly accesses identical data is executed, that is, when an application program that performs a memory access having a high locality is executed, the information processing device 20 is able to reduce a time in which the memory is accessed and implement an efficient process.

Further, when writing or reading of data is performed on a second region in which the second access process is instructed as the access method, the processing circuit 22 of the information processing device 20 transmits the access request according to the second access process to the memory device 30. Upon receiving the access request for accessing the second region in which the second access process is set from the information processing device 20, the access controller 52 of the memory device 30 directly performs writing or reading on the target data stored in the shared memory 31 in units or bytes.

As the second access process is executed as described above, the information processing device 20 is able to access data with a small processing amount. Accordingly, for example, when an application program that accesses a plurality of different pieces of data once, that is, an application program that performs memory access with low locality is executed, the information processing device 20 is able to eliminate the overhead of the transfer process and implement the efficient process.

Figure 5:
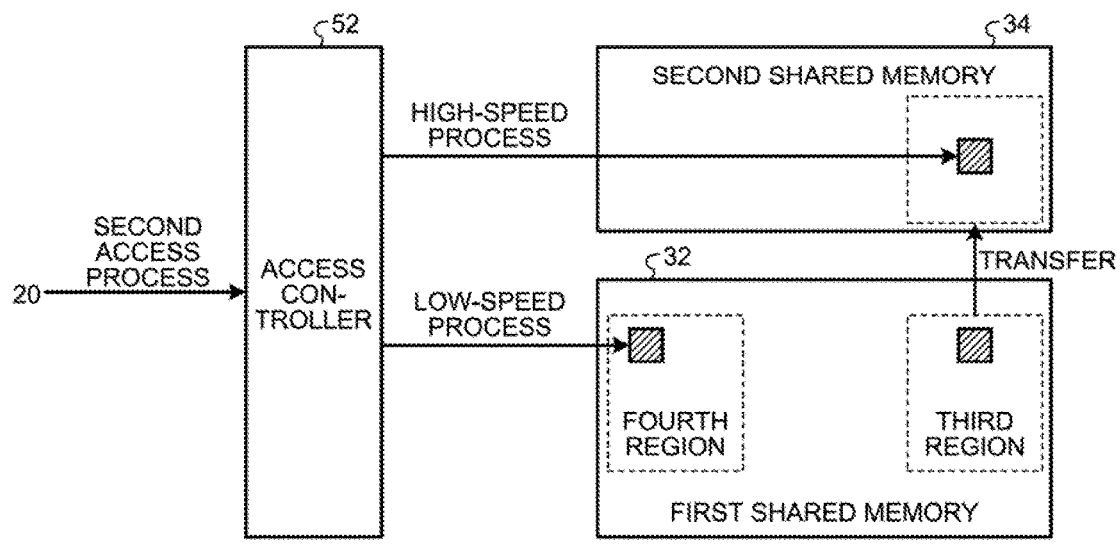
FIG. 5 is a diagram for describing a high-speed process and a low-speed process in the second access process.

FIG. 5 is a diagram for describing the high-speed process and the low-speed process in the second access process.

Upon receiving the access request according to the second access process from the information processing device 20 for a third region where the high-speed process is set as the access method, the access controller 52 executes the high-speed process.

Specifically, when the setter 56 sets the high-speed process for the third region, the access controller 52 transfers data stored in the third region in the first shared memory 32 to the second shared memory 34 in advance. Then, upon receiving the access request according to the second access process from the information processing device 20 for the third region in which the high-speed process is set, the access controller 52 directly performs writing or reading on the data transferred to the second shared memory 34 in units of cache lines or units of bytes.

Further, the access controller 52 may transfer all pieces of data included in the third region to the second shared memory 34 in advance or may transfer some pieces of data in the third region to the second shared memory 34. In the third region, when the access request for accessing data not transferred to the second shared memory 34 is received, the access controller 52 directly performs writing or reading on the first shared memory 32. Instead, the access controller 52 may transfer the data stored in the first shared memory 32 to the second shared memory 34 when the number of received access requests is equal to or more than a threshold value and then perform writing or reading on the second shared memory 34.

Further, the access controller 52 may be further divides the third region into a plurality of sub regions and transfer all pieces of data stored in a sub region in which the number of received access requests is equal to or more than a threshold value in the first shared memory 32 to the second shared memory 34. Thereafter, for example, when the memory access to the second shared memory 34 occurs for the region other than the sub region whose data is transferred consecutively more than a threshold value, the access controller 52 may write the data transferred to the second shared memory 34 in the sub region back in the first shared memory 32. For example, data indicating each layer of a neural network in deep learning configured with a plurality of layers may correspond to each sub region.

Further, for example, when data included in the third region is concurrently read through a predetermined number or more of information processing devices 20 or when the number of accesses per unit time is large, the access controller 52 may transfer the data included in the third region to a plurality of locations in the second shared memory 34. Accordingly, the access controller 52 is able to distribute the access location in the second shared memory 34.

Further, in the high-speed process, for example, when an amount of data transferred to the second shared memory 34 exceeds a preset capacity or when there is a region determined to be unnecessary to be stored in the second shared memory 34, the access controller 52 may write the data stored in the second shared memory 34 back in the first shared memory 32.

Further, the access controller 52 executes the low-speed process when the access request according to the second access process is received from the information processing device 20 for a fourth region where the low-speed process is set as the access method. Specifically, upon receiving the access request according to the second access process from the information processing device 20 for the fourth region in which the low-speed process is set, the access controller 52 directly performs writing or reading on the fourth region in the first shared memory 32 in units of bytes.

The second shared memory 34 has a faster response speed than the first shared memory 32. Therefore, when the high-speed process is executed, the access controller 52 is able to respond to the access request at a high speed.

Further, when the low-speed process is executed, the access controller 52 may not perform transfer from the first shared memory 32 to the second shared memory 34. Therefore, when the low-speed process is executed, the access controller 52 is able to reduce the processing amount.

Figure 6:
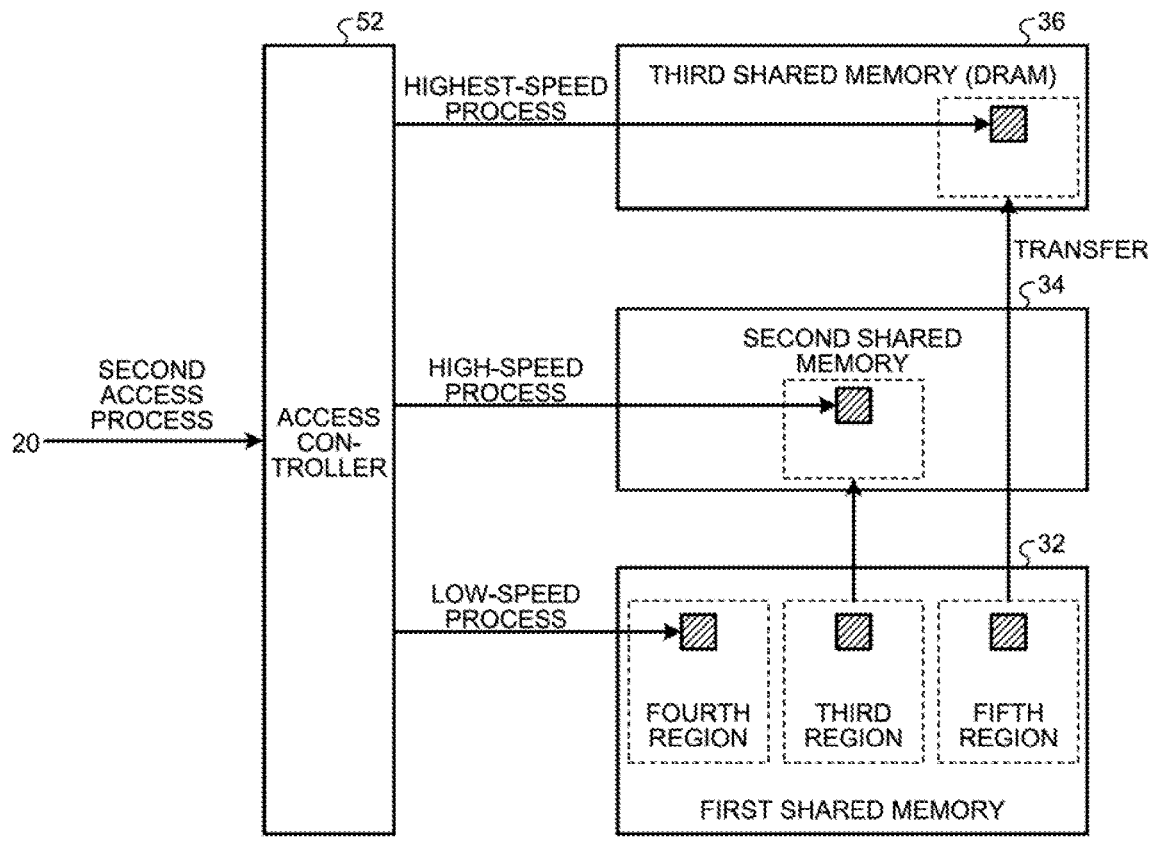
FIG. 6 is a diagram for further describing the highest-speed process in the second access process.

FIG. 6 is a diagram for further describing the highest-speed process in the second access process. The shared memory 31 may further include a third shared memory 36 in addition to the first shared memory 32 and the second shared memory 34. In this case, the setter 56 may further set the highest-speed process as the access method for the region in which the second access process is set.

The access controller 52 executes the highest-speed process when the access request by the second access process is received from the information processing device 20 for a fifth region in which the highest-speed process is set as the access method.

More specifically, when the setter 56 sets the highest-speed process in the fifth region, the access controller 52 transfers data stored in the fifth region in the first shared memory 32 to the third shared memory 36 in advance. Then, upon receiving the access request according to the second access process from the information processing device 20 for the fifth region in which the highest-speed process is set, the access controller 52 directly performs writing or reading in units of bytes on the data transferred in advance in the third shared memory 36.

The access controller 52 may transfer a part of the fifth region to the third shared memory 36 as in the high-speed process. In this case, the access controller 52 executes a process similar to the high-speed process. Further, in the highest-speed process, for example, when an amount of data transferred to the third shared memory 36 exceeds a preset capacity or when there is a region determined to be unnecessary to be stored in the third shared memory 36, the access controller 52 writes the data stored in the third shared memory 36 back in the first shared memory 32.

Since the third stared memory 36 is a DRAM, the response speed or the third shared memory 36 is faster than those of the first shared memory 32 and the second shared memory 34. Therefore, as the highest-speed process is executed, the access controller 52 is able to respond at a higher speed, for example, when the access requests are simultaneously received from a large number of information processing devices 20.

Figure 7:
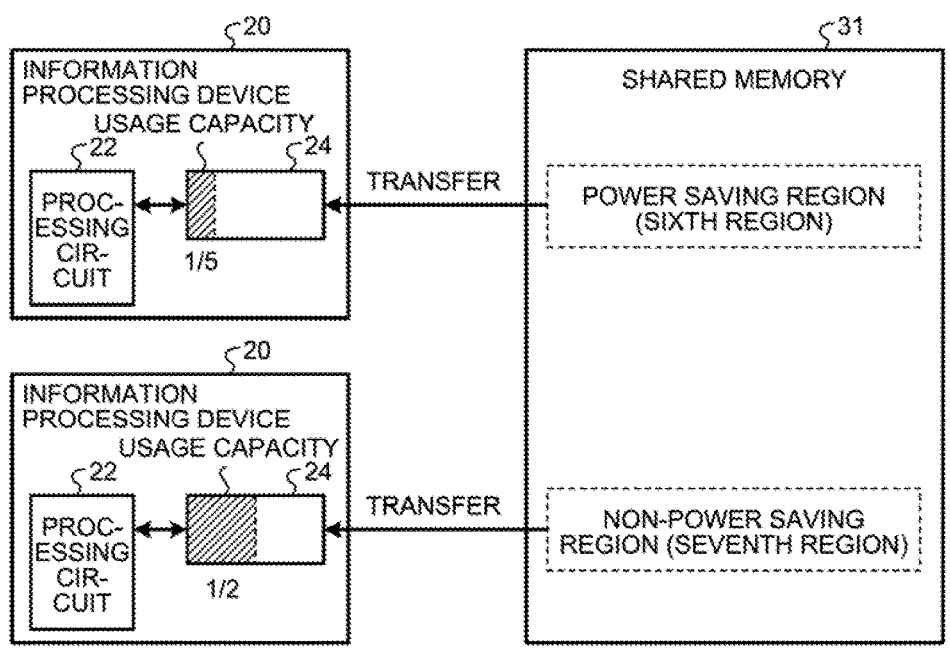
FIG. 7 is a diagram for describing content of an instruction indicating a usage capacity in an individual memory.

FIG. 7 is a diagram for describing content of the instruction indicating the usage capacity in the individual memory 24. In the information processing device 20 that accesses the first region decided as the first access process, an instruction indicating the usage capacity of the individual memory 24 is further given. The information processing device 20 that has received the instruction indicating by the usage capacity stores the data transferred from the shared memory 31 in the individual memory 24 within the range of the indicated usage capacity.

For example, the information processing device 20 forms a self-refresh state or the like by supplying electric power to a DRAM constituting a memory region and stopping the supply of electric power to a DRAM constituting other memory regions. For example, when Linux (a registered Trademark) is executed as the operating system, the information processing device 20 is able to control an operation size of such DRAM using a groups function.

The analyzer 54 may decide whether the first region for which the access method is decided to be the first access process is a power saving region (sixth region) or a non-power saving region (seventh region). For example, the analyzer 54 may decide to set the first region in which the number of accesses per unit time is equal to or smaller than a predetermined value as the power saving region (sixth region) and decide to set the first region in which the number of accesses per unit time is larger than a predetermined value as the non-power saving region (seventh region).

In this case, the setter 56 gives an instruction indicating a first value to the information processing device 20 which accesses the power saving region (sixth region) as the usage capacity for storing the data of the sixth region in the individual memory 24. The first value may be, for example, a first proportion (for example, a ⅕ size) to the size of the sixth region. The information processing device 20 which accesses the sixth region operates the memory region corresponding to the instructed usage capacity in the individual memory 24 and stops the operation of the other memory region in order to store the data stored in the sixth region in the individual memory 24.

Further, the setter 56 gives an instruction indicating a second value larger than the first value to the information processing device 20 which accesses the non-power saving region (seventh region) as the usage capacity for storing the data of the seventh region in the individual memory 24. The second value may be, for example, a second proportion (for example, a ½ size) to the size of the seventh region. The information processing device 20 which accesses the seventh region operates the memory region corresponding to the instructed usage capacity in the individual memory 24 and stops the other memory regions in order to store the data stored in the seventh region in the individual memory 24.

As described above, the information processing device 20 is able to operate the individual memory 24 with an appropriate usage capacity. Accordingly, the information processing device 20 is able to suppress the unnecessary power consumption in the individual memory 24.

Figure 8:
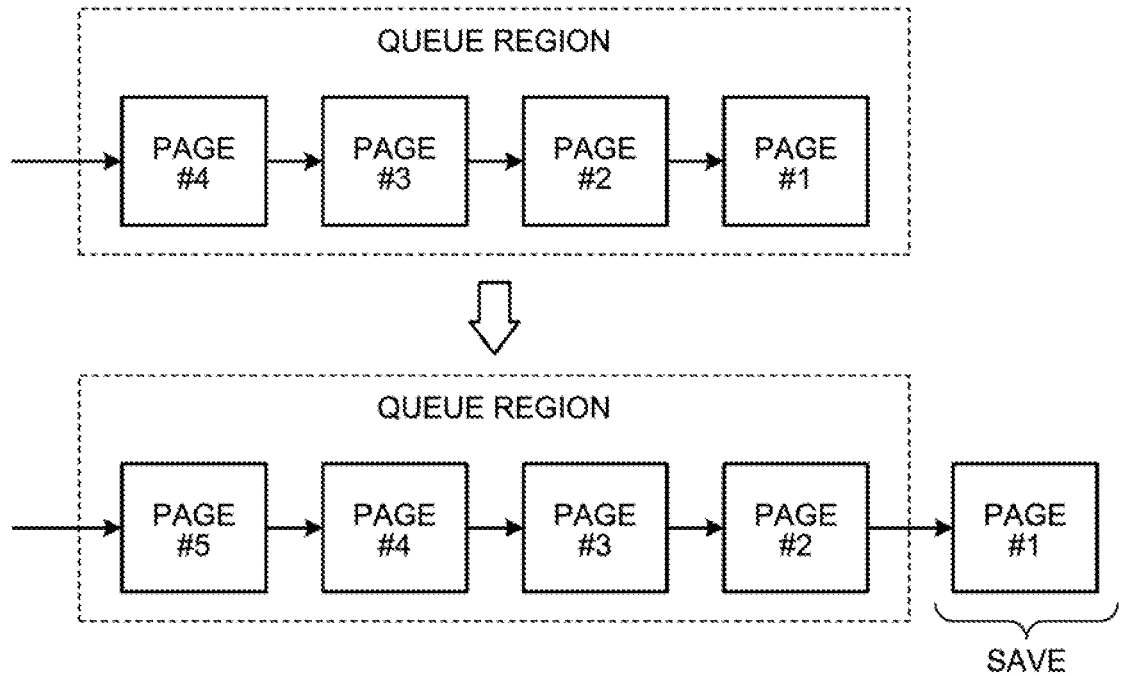
FIG. 8 is a diagram for describing a normal saving process.

FIG. 8 is a diagram for describing a normal saving process. In a case in which the first access process is executed, when the amount of data stored in the individual memory 24 reaches the instructed usage capacity, the information processing device 20 saves (writes back) a certain data block stored in the individual memory 24 in the shared memory 31 and then stores a new data block in the individual memory 24.

When an instruction indicating the first access process is given to a plurality of information processing devices 20 as the access method, the setter 56 may give an instruction indicating a saving method of deciding a data block to be saved among data blocks stored in the individual memory 24.

The setter 56 may give, for example, an instruction indicating a normal saving process or an active saving process as the saving method. For example, the setter 56 gives the instruction indicating the active saving process as the saving method for the power saving region (sixth region), and gives the instruction indicating the normal saving process as the saving method for the non-power saving region (seventh region).

In the normal saving process, the information processing device 20 sets a queue region in the individual memory 24. The capacity of the queue region is the instructed usage capacity. In an example of FIG. 8, four pages are able to be stored in the queue region.

In the normal saving process, the information processing device 20 is a region in which a data block is saved from the queue region in accordance with a least recently used (LRU) scheme. In other words, in the normal saving process, the information processing device 20 stores a new data block transferred from the shared memory 31 in the end of the queue region. In a case in which a new data block is further transferred in a state in which there is no free space in the queue region, the information processing device 20 saves a data block at the head of the queue region (that is, a data block which is written most previously) in the shared memory 31. In the example of FIG. 8, the information processing device 20 saves a page #1 which is a data block at the head in the shared memory 31. Then, after saving the data block at the head, the information processing device 20 stores a new data block in the head of the queue region.

Figure 9:
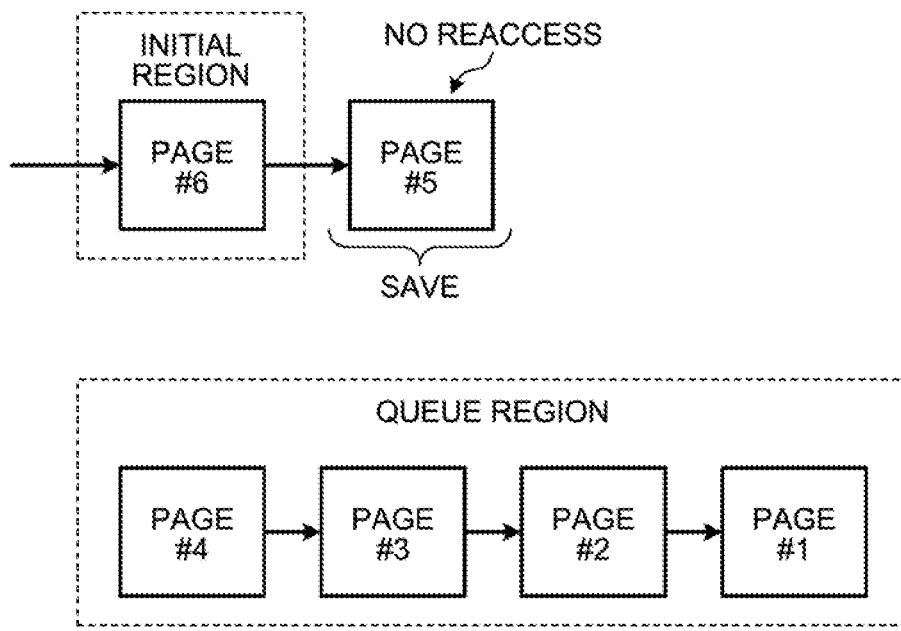
FIG. 9 is a diagram for describing a first process in an active saving process.
Figure 10:
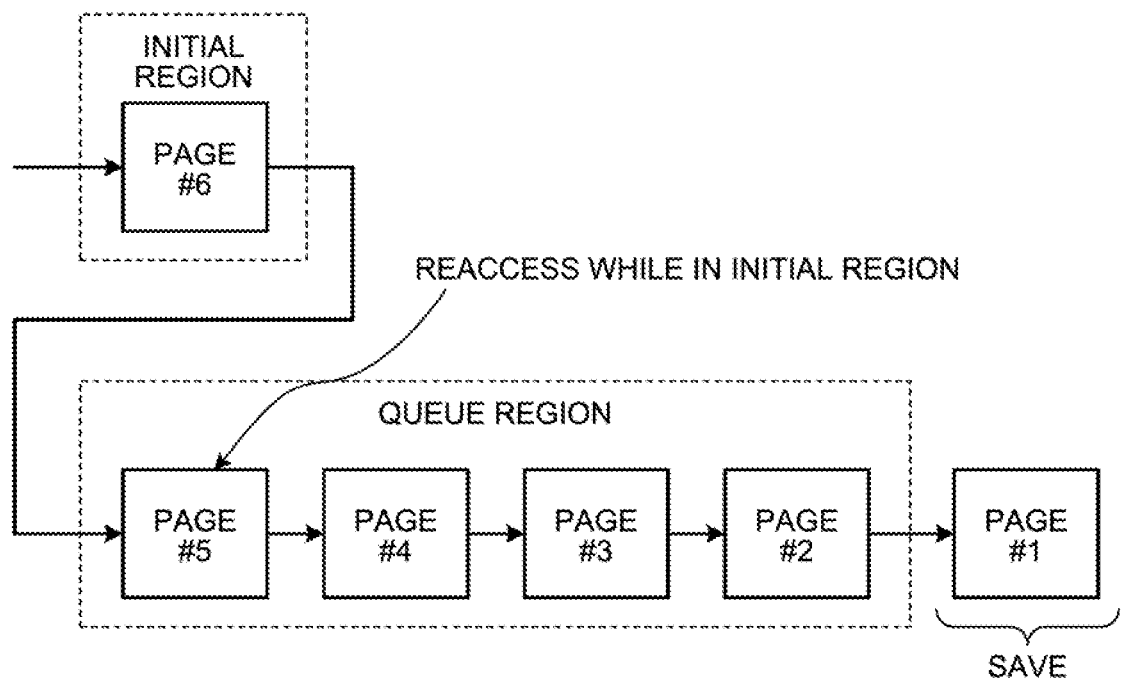
FIG. 10 is a diagram for describing a second process in the active saving process.

FIG. 9 is a diagram for describing the first process in the active saving process. FIG. 10 is a diagram for describing the second process in the active saving process.

In the active saving process, the information processing device 20 sets an initial region and a queue region in the individual memory 24. A total capacity of the initial region and the queue region is the instructed usage capacity. The initial region is a region in which the data block is saved in accordance with the LRU scheme. The queue region is a region in which the data block is saved in accordance with the LRU scheme. In examples of FIGS. 9 and 10, one page is able to be stored in the initial region. Four pages are able to be stored in the queue region.

In the active saving process, the information processing device 20 stores a new date block transferred from the shared memory 31 in the end of the initial region. When a new data block is further transferred in the state in which there is no free space in the initial region, the information processing device 20 determines whether or not the data block at the head of the initial region (that is, the data block which is most previously written in the initial region) is reaccessed, that is, determines whether or not writing or reading of data is performed again.

When the reaccess is not performed, the information processing device 20 saves the data block at the head of the initial region in the shared memory 31. In the example of FIG. 9, a page #5 which is the data block at the head of the initial region is not re-accessed. Therefore, in the example of FIG. 9, the information processing device 20 saves the page #5 in the shared memory 31. Then, after saving the page #5 in the shared memory 31, the information processing device 20 stores a new data block in the head of the initial region.

On the other hand, when the re-access is performed, the information processing device 20 stores the data block at the head of the initial region in the end of the queue region.

When the data block at the head of the initial region is transferred in the state in which there is no free space in the queue region, the information processing device 20 saves the data block at the head of the queue region (that is, the data block which is most previously written in the queue region) in the shared memory 31. In the example of FIG. 10, the information processing device 20 saves a page #1 which is the data block at the head of the queue region in the shared memory 31. Then, after saving the data block at the head, the information processing device 20 stores the data block at the head of the initial region in the head of the queue region.

By using the saving process, the information processing device 20 is able to efficiently leave data having a high access frequency in the queue region. Accordingly, the information processing device 20 is able to efficiently cache even when the usage capacity of the individual memory 24 is small for power saving.

The setter 56 may give an instruction indicating a saving method using any algorithm in addition to the normal saving process and the active saving process. For example, an instruction indicating a saving method of saving a data block may be given using machine learning. Further, the setter 56 may give an instruction indicating an identical saving method consistently. Further, the setter 56 may cause the information processing device 20 to execute the saving process in accordance with the saving method registered in advance without giving an instruction indicating the saving method.

Figures 11, 12:
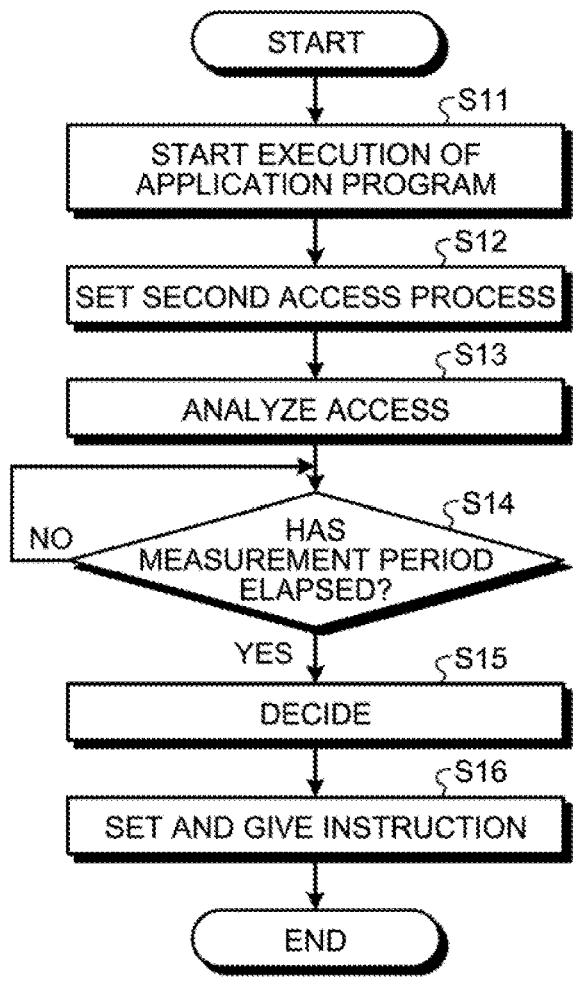
FIG. 11 is a diagram illustrating a procedure of a process of the information processing system according to the first embodiment.
FIG. 12 is a diagram illustrating an example of an analysis result.

FIG. 11 is a diagram illustrating an example of a procedure of a process or the information processing system 10 according to the first embodiment. For example, the information processing system 10 executes the process in accordance with the flow illustrated in FIG. 11.

First, in S11, a plurality of information processing devices 20 start execution of an application program. Then, in S12, the setter 56 of the memory device 30 sets the second access process in the access controller 52 as the access method of all regions. Further, the setter 56 gives an instruction indicating the second access process as the access methods of all regions to a plurality of information processing devices 20.

Then, in S13, the analyses 54 of the memory device 30 analyzes the access to the shared memory 31 by a plurality of information processing devices 20 for each of a plurality of regions. For example, the analyzer 54 acquires locality of the access, the number of accesses per unit time (an access rate), the information processing device 20 which performs the access, and the like.

Then, in S14, the analyzer 54 of the memory device 30 determines whether or not a predetermined measurement period has elapsed after the execution of the application program is started. When the measurement period has not elapsed (No in S14), the analyzer 54 of the memory device 30 causes the process to be on standby in S14. When the measurement period has elapsed (Yes in S14), the analyzer 54 of the memory device 30 causes the process to proceed to S15.

In S15, the analyzer 54 of the memory device 30 decides on the access method of each region on the basis of an analysis result. Then, in S16, the setter 56 of the memory device 30 sets the decided access method in the access controller 52 and gives an instruction indicating the access method to a plurality of information processing devices 20.

Through the above processes, the analyzer 54 of the memory device 30 causes the data stored the shared memory 31 to be directly written or read during in the predetermined measurement period after the execution of the application program is started. Accordingly, the analyzer 54 is able to accurately analyze the access to all the regions and decide on an appropriate access method. The information processing system 10 may also execute the process of S12 to S16 at regular time intervals even after the access method is decided.

FIG. 12 is a diagram illustrating an example of me analysis result. As an example, the analyzer 54 acquires memory access information illustrated in FIG. 12 as an analysis result for each of a plurality of regions.

For example, the analyzer 54 analyzes the statistical information for the access by a plurality of information processing devices 20 and acquires the memory access information indicating whether the locality is higher than a predetermined value or the locality is lower than or equal to a predetermined value (low) for each of a plurality of regions. Here specifically, for example, the analyzer 54 measures the number of accesses of each minute unit (for example, a page or a byte) within the region for each of a plurality of regions. The analyzer 54 calculates a variation (for example, a variance) in the access within the region on the basis of the measured number of accesses of each minute unit. Then, when the calculated variance is smaller than a predetermined value, the analyzer 54 may decide that the locality is higher than the predetermined value, and when the variation is equal to or larger than the predetermined value, the analyzer 54 may decide that the locality is equal to or less than the predetermined value. The analyzer 54 may decide whether the locality is higher than the predetermined value using any other method.

Further, for example, the analyzer 54 may analyze the statistical information for the access by a plurality of information processing devices 20 and acquire the memory access information indicating the information processing device 20 that has performed the access for each of a plurality of regions. For example, the analyzer 54 may acquire an identification number of the information processing device 20 that has performed the access for each region.

Further, for example, the analyzer 54 analyses the statistical information for the access by a plurality of information processing devices 20, and acquires access information indicating whether the number of accesses per unit time (access rate) is higher than a predetermined value or the access rate is lower than or equal to the predetermined value (low). More specifically, for example, the analyzer 54 may detect the number of accesses at fixed time intervals for each region and calculate an average value of the number of accesses at fixed time intervals as the access rate.

Further, the analyzer 54 may obtain other statistical information for the access by a plurality of information processing devices 20 in addition to the above access statistical information. Furthermore, the analyzer 54 may acquire any other analysis results from the statistical information in addition to the analysis result (the memory access information) mentioned above.

Figure 13:
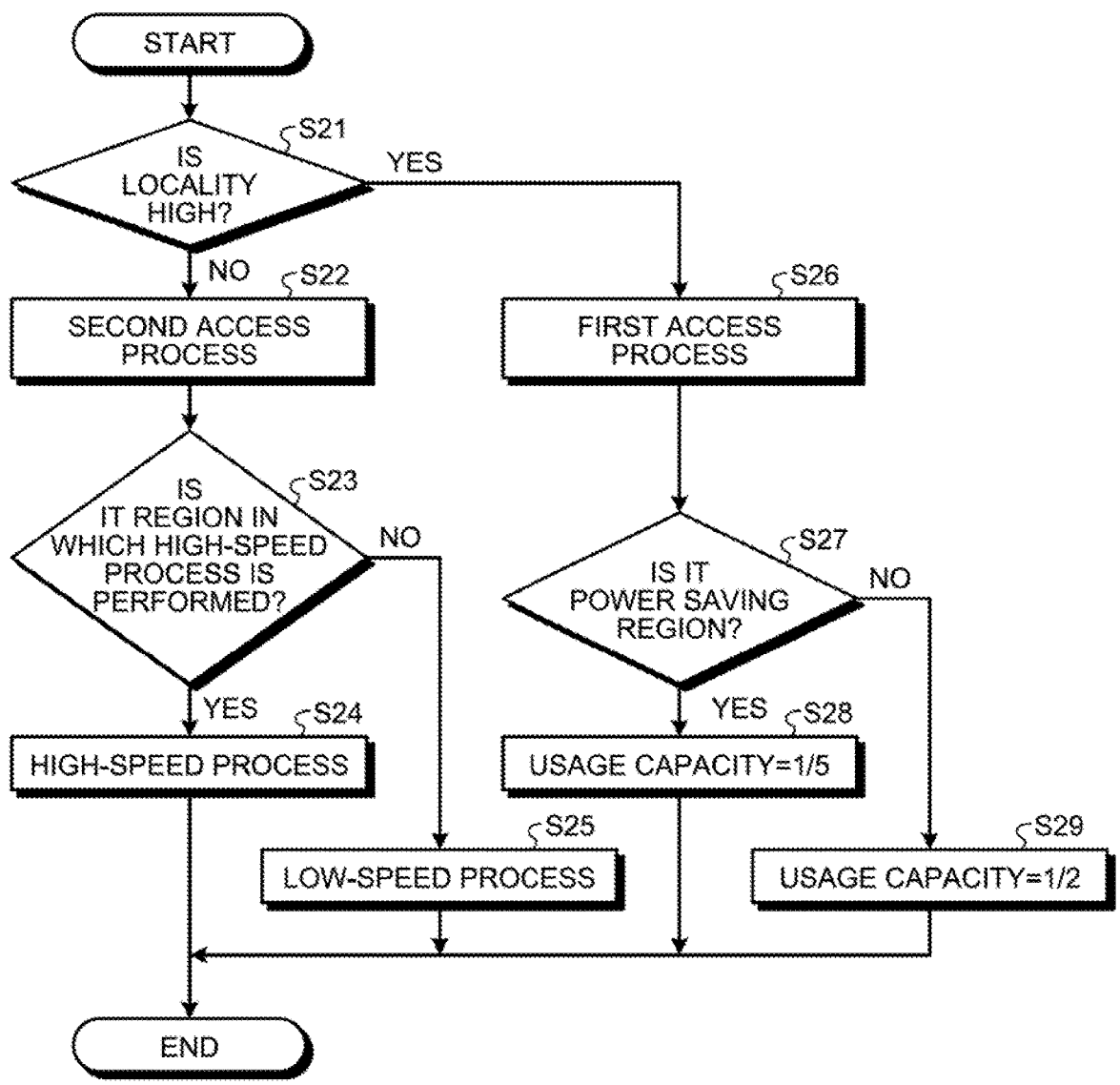
FIG. 13 is a diagram illustrating an example of a procedure of a process of deciding an access method.

FIG. 13 is a diagram illustrating an example of a procedure of a process of deciding the access method. The analyzer 54 decides on the access method for each of a plurality of regions in accordance with, for example, the flow illustrated in FIG. 13.

First, in S21, the analyzer 54 determines whether or not the locality is higher than a predetermined value. When the region is the second region whose locality is equal to or less than the predetermined value (No in S21), the analyzer 54 causes the process to proceed to S22. When the region is the first region whose locality is higher than the predetermined value (Yes in S21), the analyzer 54 causes the process to proceed to S26.

In S22, the analyzer 54 decides on the access method of the region as the second access process. The analyzer 54 causes the process to proceed to S23, subsequently to S22.

In S23, the analyzer 54 determines whether or not the second region for which the access method is decided to be the second access process is a region for which the high-speed process is performed. For example, the analyzer 54 determines whether or not the second region is a region which is accessed from a predetermined number or more of information processing devices 20.

When the region is a region in which the high-speed process is performed, for example, when the region is accessed from a predetermined number or more of the information processing devices 20 (Yes in S23), the analyzer 54 causes the process to proceed to S24. Then, in S24, the analyzer 54 decides to set the second region as the third region for which the high-speed process is performed.

When the region is not a region in which the high-speed process is performed, for example, when the region is not accessed from a predetermined number or more of information processing devices 20 (No in S23), the analyzer 54 causes the process to proceed to S25. Then, in S25, the analyzer 54 decides to set the second region as the fourth region for which the low-speed process is performed.

On the other hand, in S26, the analyzer 54 decides to set the first access process as the access method of the region. The analyzer 54 causes the process to proceed to S27, subsequently to S26.

In S27, the analyzer 54 determines whether or not the first region in which the access method is decided to be the first access process is the power saving region. For example, the analyzer 54 determines whether or not the first region is a region in which the number of accesses per unit time is equal to or smaller than a predetermined value.

When the region is the power saving region, for example, when the number of accesses per unit time is a region in which the number of accesses per unit time is equal to or smaller than a predetermined value (Yes in S27), the analyzer 54 causes the process to proceed to S28. In S28, the analyzer 54 decides to set a first value (for example, a ⅕ size of the region) as the usage capacity of the individual memory 24 for the first region.

When the region is not the power saving region, for example, when the region is a region in which the number of accesses per unit time is larger than a predetermined value (No in S27), the analyzer 54 causes the process to proceed to S29. Then, is S29, the analyzer 54 decides to set a second value (for example, the ½ size of the region) larger than the first value as the usage capacity of the individual memory 24 for the first region.

When the analyzer 54 ends the process of S24, S25, S28, or S29, the analyzer 54 ends the present flow for the corresponding region.

Figures 14, 15:
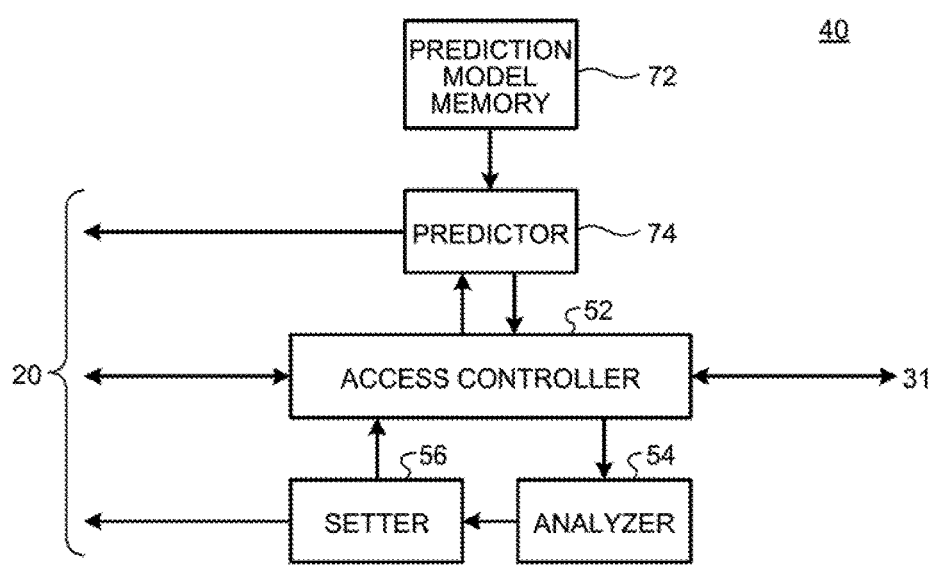
FIG. 14 is a diagram illustrating an example of a setting table of an access method.
FIG. 15 is a diagram illustrating a configuration of a memory controller according to a second embodiment.

FIG. 14 is a diagram illustrating an example of a setting table of the access method. The setter 56 sets the access method decided by the analyzer 54, for example, in the setting table. For example, the setter 56 sets a first access process or a second access process in the setting table as the access method for each region as illustrated in FIG. 14.

Further, when the first access process is set as the access method, the setter 56 further sets the usage capacity of the individual memory 24 in the setting table. Further, when the second access process is set as the access method, the setter 56 further sets the low-speed process or the high-speed process in the setting table.

Further, the setter 56 further sets the identification number of the information processing device 20 that performs the access in the setting table for each region. Then, the setter 56 gives an instruction indicating the access method and usage capacity set for the region to the information processing device 20 that accesses each of a plurality of regions.

(Effects)

As described above, in the information processing system 10, the memory device 30 gives an instruction indicating the access method for accessing the shared memory 31 to each of a plurality of information processing devices 20. The general memory control device according to the related art executes a passive process of performing a process in accordance with reception of data writes or read request. On the other hand, the memory device 30 executes the active process of giving an instruction indicating an operation method to a plurality of information processing devices 220.

Accordingly, the information processing system 10 is able to enable each of a plurality of information processing devices 20 to access the memory device 30 using an appropriate access method in accordance with a combination of application programs executed by a plurality of information processing devices 20 or the like. Therefore, according to the information processing system 10, it is possible to improve reliability by suppressing the power consumption of the whole system, increasing the processing speed, and slowing down the deterioration speed of the memory device 30.

Further, the memory device 30 is able to enable two or more information processing devices 20 to access identical data. Therefore, in the information processing system 10, data can be exchanged between two or more information processing devices 20 without going through a network. Accordingly, according to the information processing system 10, even when large-scale data processing is executed, the transfer process has no bottleneck, and the process can be executed at a high speed.

Further, the information processing system 10 causes the memory device 30 having a small standby power to function as a stain memory device of a plurality of information processing devices 20. Accordingly, the information processing system 10 can reduce the power consumption even when large-scale data processing is executed.

As described above, the information processing system 10 according to the present embodiment can efficiently execute the data processing using a plurality of information processing devices 20.

Second Embodiment

FIG. 15 is a diagram illustrating a configuration of the memory controller 40 according to a second embodiment. The memory controller 40 according to the second embodiment further includes a predict ion model memory 72 and a predictor 74.

The prediction model memory 72 stores a prediction model. The prediction model refers to a model for specifying data predicted to be accessed by a plurality of information processing devices 20 on the basis of a pattern of access to the shared memory 31 by a plurality of information processing deices 20. The prediction model is generated in advance by learning or the like. The prediction model memory 72 may be disposed outside the memory device 30.

The predictor 74 acquires the pattern of the access to the shared memory 31 by each of a plurality of information processing devices 20 from the access controller 52. For example, the predictor 74 acquires a pattern such as a data position of the shared memory 31 accessed by each of a plurality of information processing devices 20.

The predictor 74 specifies first data predicted to be accessed by the information processing device 20 on the basis of the acquired pattern and the prediction model. The first data may be data of a byte unit or data of a block unit including data predicted to be accessed. When the first data is specified, the predictor 74 instructs the information processing device 20 predicted to access the first data among a plurality of information processing devices 20 to obtain the first data in advance. Then, the information processing device 20 that has received the instruction transmits an access request for acquiring the first data to the access controller 52. For example, the information processing device 20 that has received the instruction may acquire the first data through the second access process.

Accordingly, the information processing device 20 is able to acquire the first data predicted to be accessed in the future in advance. Accordingly, the information processing device 20 is able to execute the data process on the first data at a higher speed.

Further, the predictor 74 specifies second data predicted to be accessed by a plurality of information processing devices 20 on the basis of the acquired pattern and the prediction model. Then, when the second data is specified, the predictor 74 causes the access controller 52 to perform transfer to another memory whose response speed is faster than that of the memory in which the second data is stored in advance.

For example, the access controller 52 instructs the information processing device 20 predicted to access the second data to transfer the specified second data to the individual memory 24 in advance. In this case, the information processing device 20 that has received the instruction transmits the access request according to the first access process to the access controller 52 in order to acquire the second data. Accordingly, the information processing device 20 is able to transfer the second data predicted to be accessed in the future to the individual memory 24 in advance.

Further, for example, when the shared memory 31 includes the first shared memory 32 and the second shared memory 34, the second data stored in the first shared memory 32 may be transferred to the second shared memory 34. The second shared memory 34 has a faster response speed than the first shared memory 32.

As described above, the access controller 52 is able to store the second data predicted to be accessed in the future in a high-speed memory in advance. Accordingly, the information processing device 20 is able to execute the data processing on the second data at a higher speed.

Third Embodiment

Figure 16:
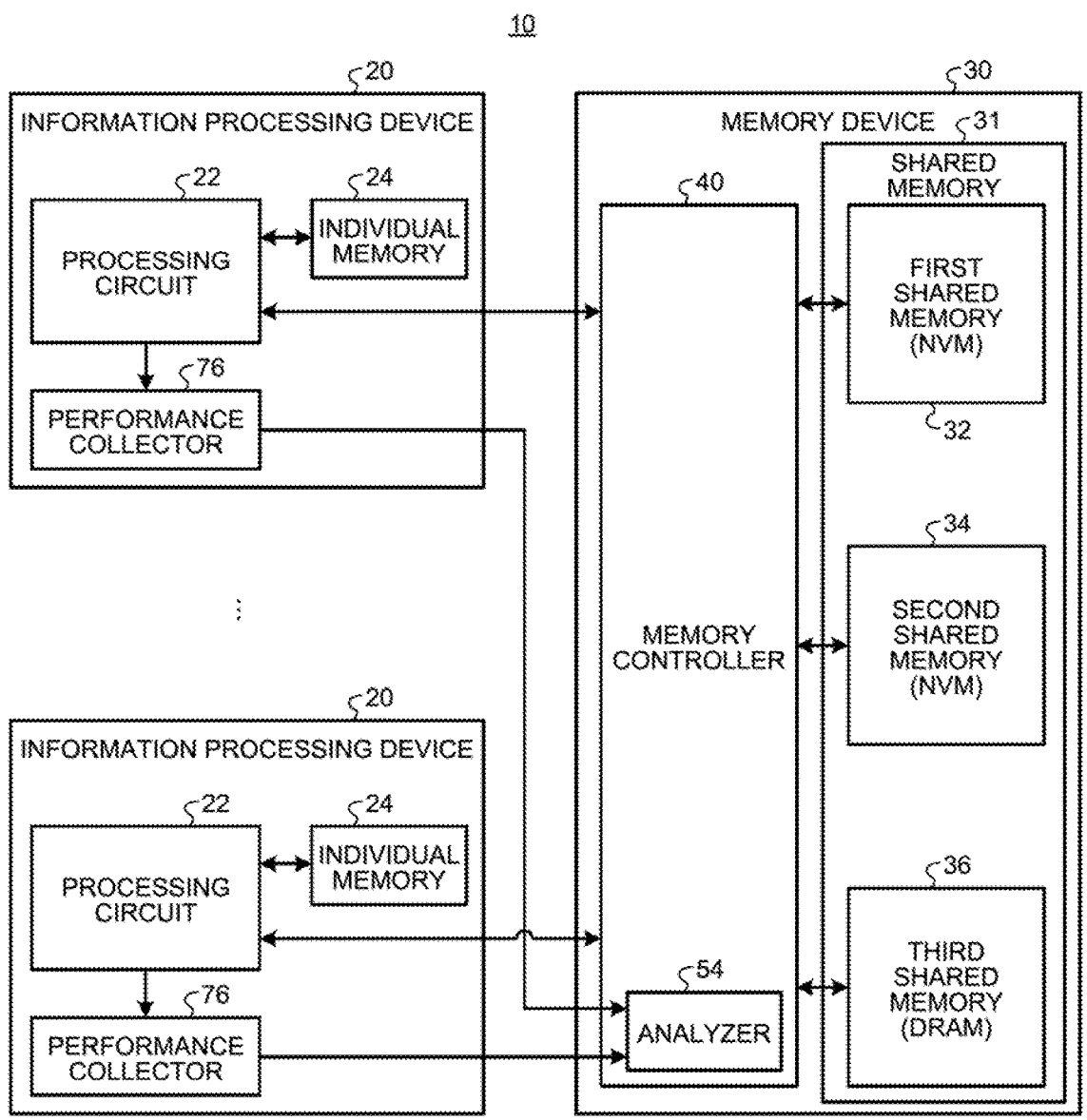
FIG. 16 is a diagram illustrating a configuration of an information processing system according to a third embodiment.

FIG. 16 is a diagram illustrating a configuration of an information processing system 10 according to a third embodiment. The information processing device 20 according to the third embodiment further includes a performance collector 76.

The performance collector 70 analyzes a program execution operation performed by the processing circuit 22 and acquires an analysis result. As an example, the performance collector 76 detects a cache miss occurred when the processing circuit 22 executes a program. For example, the performance collector 76 detects a bifurcation process occurred when the processing circuit 22 executes a program. Further, the performance collector 76 detects a usage rate of the processor used by the processing circuit 22 as an example. The performance collector 76 may be, for example, a performance counter that acquires a cache miss rate, a CPU bifurcation miss-prediction rate, a CPU usage rate, and the like. Then, the performance collector 76 gives the analysis result to the memory controller 40 of the memory device 30 as operation statistical information.

The shared memory interface connecting each of a plurality of information processing devices 20 with the memory device 30 has a function of transferring the operation statistical information from each of a plurality of information processing devices 20 to the memory controller 40 of the memory device 30. The performance collector 76 transmits the operation statistical information to the memory controller 40 of the memory device 30 via the shared memory interface.

The analyzer 54 of the memory controller 40 acquires the operation statistical information which is the analysis result from the performance collector 76 of each of a plurality of information processing devices 20. Then, the analyzer 54 decides on the access method for each region in the shared memory 31 further on the basis of the acquired analysis result.

For example, the analyzer 54 may decide that a region in which a cache miss frequency per unit time is greater than a predetermined value is a region in which the locality is equal to or less than a predetermined value. Further, for example, the analyzer 54 may decide that a region in which a bifurcation process frequency per unit time is greater than a predetermined value is a region in which the locality is equal to or less than a predetermined value as well. Further, the analyzer 54 may decide on the degree of parallelism of the processes executed by the processing circuit 22 on the basis of the usage rate of the processor. For example, the analyzer 54 may change the degree of parallelism to be increased when the usage rate of the processor is low.

As described above, using the result of analyzing the program execution operation performed by the processing circuit 22, the analyzer 54 is able to analyze the access to the shared memory 31 by a plurality of information processing devices 20 with a high degree of accuracy. Therefore, the analyzer 54 is able to decide on a more appropriate access method.

Fourth Embodiment

Figure 17:
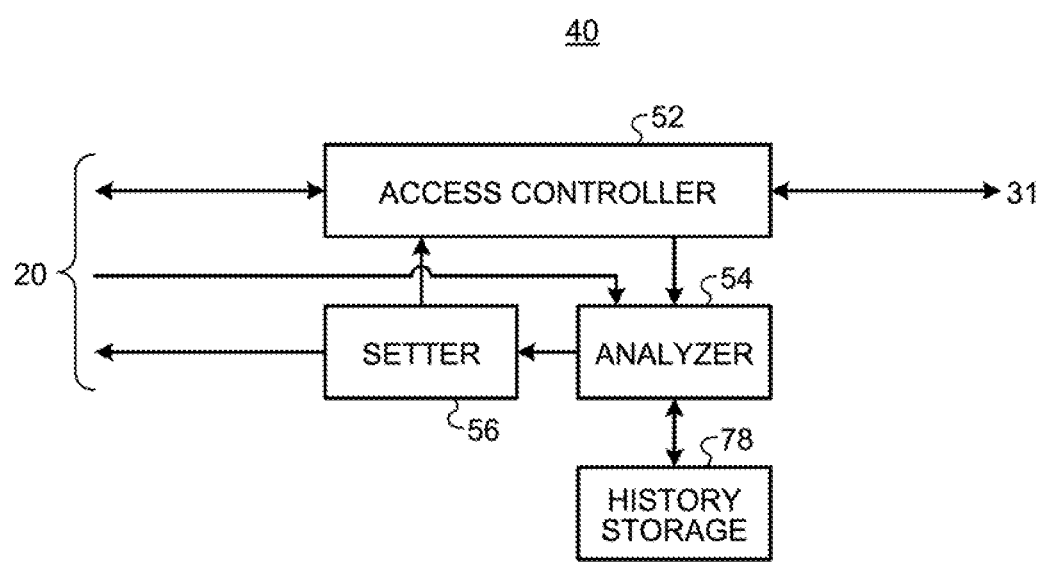
FIG. 17 is a diagram illustrating a configuration of a memory controller according to a fourth embodiment.

FIG. 17 is a diagram illustrating a configuration of the memory controller 40 according to a fourth embodiment. The memory controller 40 according to the fourth embodiment further includes a history memory 78. The history memory 78 stores a history of the access method which is set previously in association with application programs executed in a plurality of information processing devices 20.

The analyzer 54 acquires information identifying the application programs executed in a plurality of information processing devices 20. When the access method is decided, the analyzer 54 stores the decided access method in the history memory 78 in association with the application programs executed in a plurality of information processing devices 20.

Furthermore, when the history corresponding to the application programs executed in s plurality of information processing devices 20 is stored in the history memory 78, the analyzer 54 decides on the access method on the basis of the history before a measurement period elapses.

Figure 18:
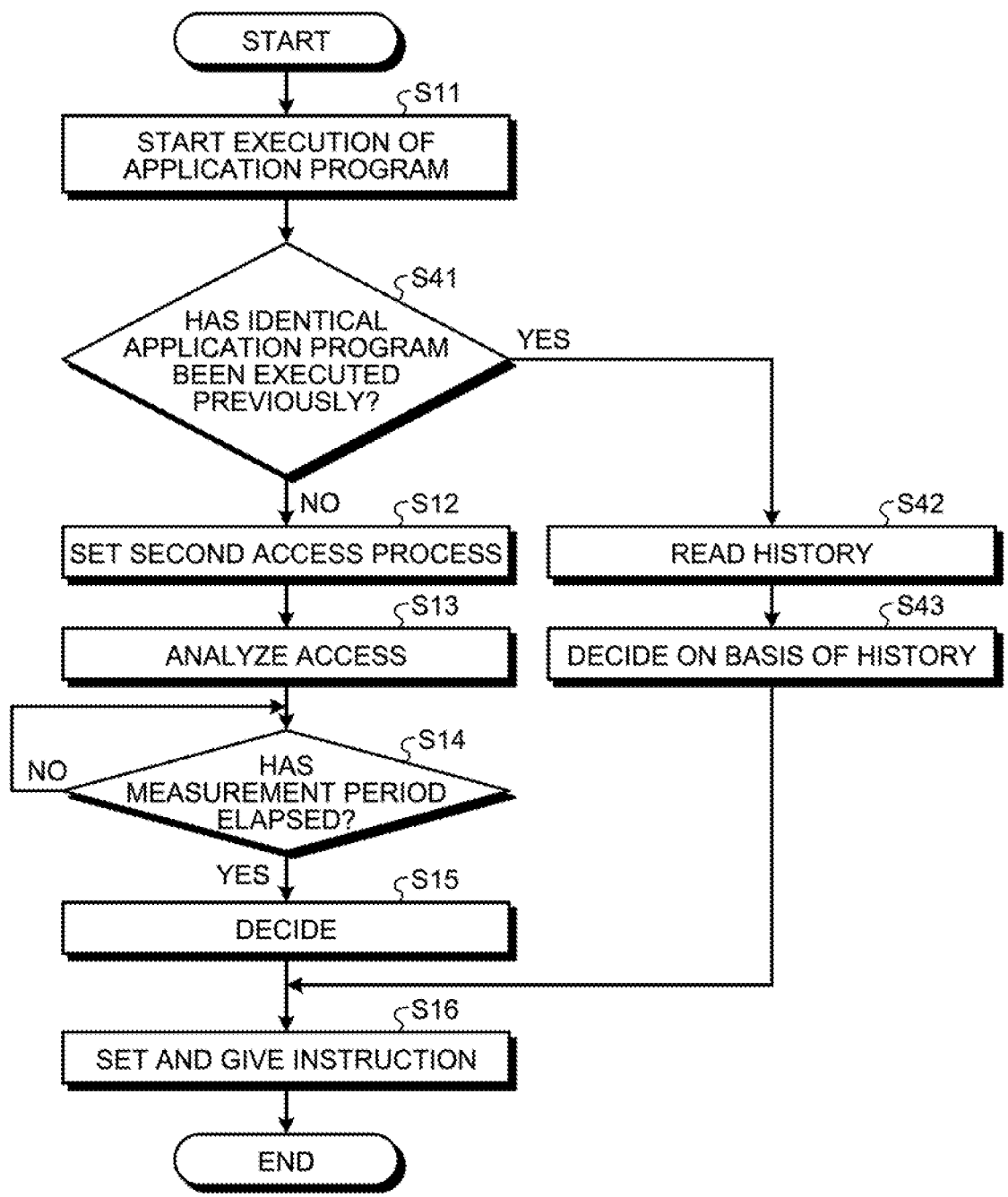
FIG. 18 is a diagram illustrating a procedure of a process of an information processing system according to the fourth embodiment.

FIG. 18 is a diagram illustrating an example of a procedure of a process of the information processing system 10 according to the fourth embodiment. The information processing system 10 according to the fourth embodiment executes the process in accordance with the flow illustrated in FIG. 18.

First, in S11, a plurality of information processing devices 20 start execution of the application program.

Then, in S41, the analyzer 54 of the memory device 30 obtains information identifying the application program being executed from each of a plurality of information processing devices 20. Then, the analyzer 54 determines whether or not the identical application program has been executed previously. When the identical application program has not been executed previously (No in S41), the analyzer 54 causes the process to proceed to S12. Since a subsequent process including S12 is the same as the process illustrated in FIG. 11, description thereof is omitted.

When the identical application program has been executed previously (Yes in S41), the analyzer 54 causes the process to proceed to S42. In S42, the analyzer 54 acquires the history of the access method corresponding to the application programs executed in a plurality of information processing devices 20 from the history memory 78.

Subsequently to S42, in S43, the analyzer 54 decides on the access method on the basis of the acquired history. For example, the analyzer 54 decides to set the access method to the same content as the acquired history. When the analyzer 54 ends the process of S43, the process proceeds to S16. Since the process of S16 is the same as the process illustrated in FIG. 11, description thereof is omitted.

As described above, when the application program executed by each of a plurality of information processing devices 20 has been executed previously, the analyzer 54 according to the fourth embodiment is able to decide on the access method before the measurement period elapses. Accordingly, the information processing device 20 is able to access the memory device 30 using an appropriate access method in a short time after the execution of the application program is started.

Fifth Embodiment

Figure 19:
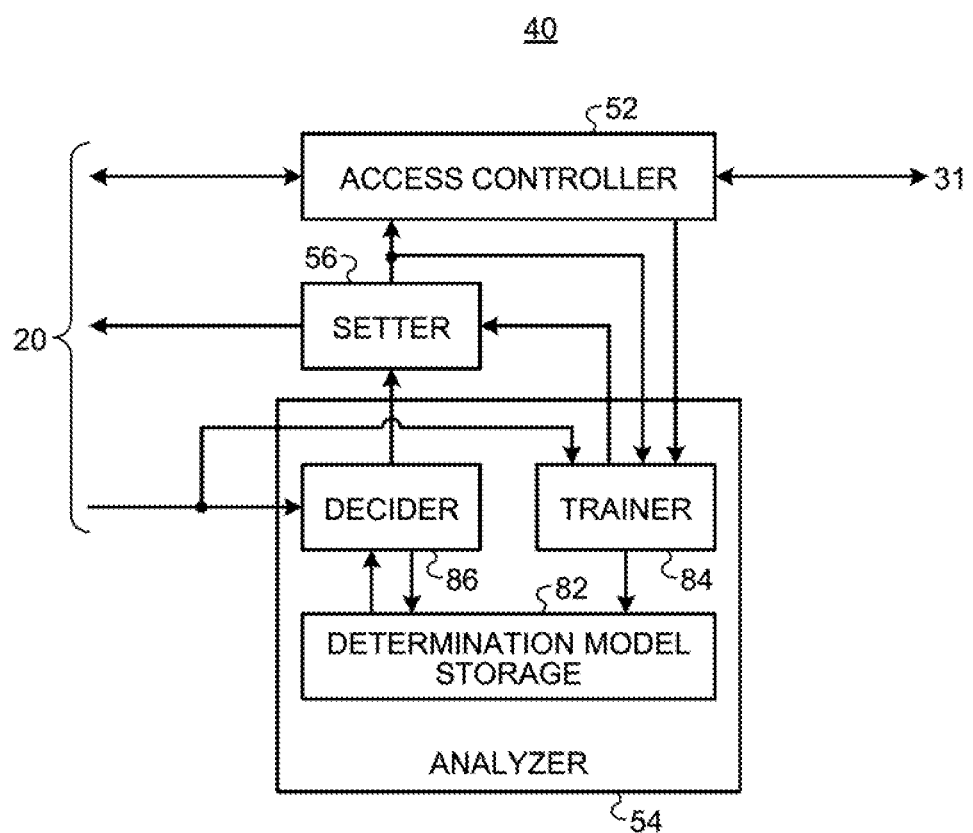
FIG. 19 is a diagram illustrating a configuration of a memory controller according to a fifth embodiment.

FIG. 19 is a diagram illustrating a configuration of the memory controller 40 according to a fifth embodiment. The analyzer 54 according to the fifth embodiment includes a determination model memory 82, a trainer 84, and a decider 86. In the fifth embodiment, the analyzer 54 performs switching between a learning phase and usage phase.

The determination model memory 82 stores a determination model (a decision model). The determination model refers to a model for obtaining an optimal access method on the basis of operation information. For example, the determination model may be implemented by a decision tree or the like. The operation information refers to information obtained as a result of executing the application program by a plurality of information processing devices 20, and includes, for example, statistical information related to an operation of the processor, an execution time (for example, a throughput when a plurality of application programs are operated at the same time), power consumption of the whole system, the statistical information for the access to the shared memory 31, an analysis result obtained by analyzing the statistical information, and the like. The statistical information related to the operation of the processor refers to information that is able to be acquired by, for example, a performance counter of the processor, and specifically includes a cache miss rate, a CPU bifurcation miss-prediction rate, a CPU usage rate, and the like.

The trainer 84 learns the determination model in the learning phase. Specifically, in the learning phase, the trainer 84 controls the setter 56 while operating a plurality of information processing devices 20 such that the setting of the access method for the access controller 52 and the instruction of the access method for a plurality of information processing devices 20 are changed, and learns the determination model. More specifically, for example, the trainer 84 causes the setter 56 to change the instruction of the access methods and causes a plurality of information processing devices 20 to execute the identical application program twice or more. The trainer 84 collects the statistical information for the access to the shared memory 31, the statistical information related to the operation of the processor, trace information related to the execution time and/or the power consumption, and the like which are obtained by the execution of the application programs. Then, for example, using the collected information as an input, the trainer 84 learns the determination model so that the execution time, the power consumption, and the like of the application program are optimized. Furthermore, in the learning phase, the trainer 84 changes the application programs to be executed by a plurality of information processing devices 20 and learns the determination model. In the learning phase, when a plurality of information processing devices 20 simultaneously execute a plurality of application programs, the trainer 84 changes a combination thereof as well and learns the determination model.

In the usage phase, the decider 86 operates a plurality of information processing devices 20 and acquires the operation information. Then, the decider 86 decides on the access method on the basis of the acquired operation information and the learned determination model. The decider 86 transmits the decided access method to the setter 56.

As described above, the analyzer according to the fifth embodiment decides on the access method using the determination model learned in advance. Thus, according to the analyzer 54, it is possible to decide on a more appropriate access method.

Sixth Embodiment

FIGS. 20A and 20B are diagrams illustrating an example of a process of an information processing system 10 according to a sixth embodiment. On the basis of the usage capacity instructed to a plurality of information processing devices 20, the analyzer 54 determines whether or not the application programs being executed in two or more target information processing devices 20 among a plurality of information processing devices 20 are executed through a first information processing device 20-1 which is one of a plurality of information processing devices 20.

For example, an instruction indicating the usage capacity of the individual memory 24 is given to the first information processing device 20-1 and a second information processing device 20-2 as illustrated in FIG. 20A. The first information processing device 20-1 executes "A" as the application program. The second information processing device 20-2 executes "B" as the application program. Further, the setter 56 gives an instruction indicating "a" as the usage capacity of the individual memory 24 for to the first information processing device 20-1. Further, the setter 56 gives an instruction indicating "b" as the usage capacity of the individual memory 24 to the second information processing device 20-2.

The analyzer 54 determines whether or not the free space of the individual memory 24 of the first information processing device 20-1 is larger than the usage capacity instructed to the second information processing device 20-2. When the free space of the individual memory 24 of the first information processing device 20-1 is larger than the use capacity instructed to the second information processing device 20-2, the analyzer 54 determines that the first information processing device 20-1 is able to execute the application program being executed by both the first information processing device 20-1 and the second information processing device 20-2.

When the first information processing device 20-1 is determined to be able to execute the application program being executed by the first information processing device 20-1, the setter 56 gives an instruction indicating a total amount of the usage capacity instructed to the two or more target information processing devices 20 to the first information processing device 20-1 as the usage capacity. Further, the setter 56 instructs the first information processing device 20-1 to start the execution of the program being executed in the two or more target information processing devices 20. Furthermore, the setter 56 instructs the information processing device 20, which is not the first information processing device 20-1 out of the two or more target information processing devices 20 to stop the execution of program and enter the power saving state. Then, the information processing device 20 which is not the first information processing device 20-1 causes the processing circuit 22 and the individual memory 24 to enter the power saving state such as a power-off state or a low power mode. Accordingly, the information processing system 10 is able to reduce the power consumption of the entire system by setting the power consumption necessary for the entire system to electric power for operating the first information processing device 20-1.

For example, the setter 56 gives an instruction indicating "a+b" which is a sum of the usage capacity instructed to the first information processing device 20-1 and the usage capacity instructed to the second information processing device 20-2 as illustrated in FIG. 20B. Further, the setter 56 gives an instruction indicating an execution time of "A" which is the application program executed by the first information processing device 20-1 and "B" which is the application program executed by the second information processing device 20-2 to the first information processing device 20-1. Further, the setter 56 instructs the second information processing device 20-2 to stop the execution of the application program B.

As the process is executed as described above, the memory device 30 according to the sixth embodiment is able to stop the execution of the application programs performed by some of the information processing devices 20. Accordingly, the information processing device 20 which has stopped the execution of the application program is able to stop the electric power supplied to the individual memory 24 or enter the self-refresh state or the like. Therefore, the memory device 30 according to the sixth embodiment is able to further reduce the power consumption.

Further, when two or more information processing devices 20 can be selected as the first information processing device 20-1, the analyzer 54 may select the information processing device 20 including the processing circuit 22 with a larger number of virtual processors according to hyperthreading or the like as the first information processing device 20-1. Accordingly, the analyzer 54 is able to increase the degree of parallelism of the process and execute the process at a high speed even when writing or reading data is performed on a memory with a small access latency.

Seventh Embodiment

Figure 21:
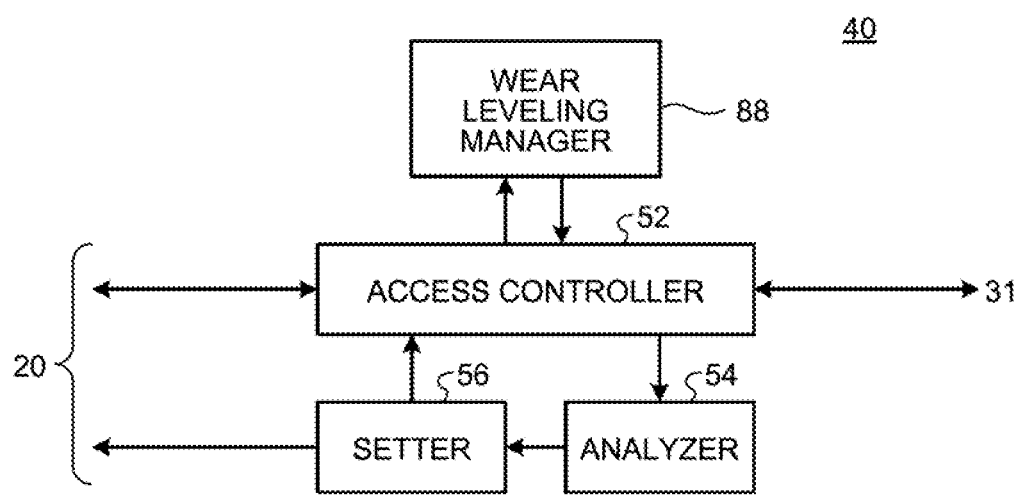
FIG. 21 is a diagram illustrating a configuration of a memory controller according to a seventh embodiment.

FIG. 21 is a diagram illustrating a configuration of a memory controller 40 according to a seventh embodiment. The memory controller 40 according to the seventh embodiment further includes a wear leveling manager 88.

The wear leveling manager 88 manages a memory region in which the number of rewritings is equal to or larger than a predetermined value in the shared memory 31. For example, the wear leveling manager 88 monitors the write process in the shared memory 31 and counts the number of rewritings for each memory region.

The access controller 52 acquires the number of rewritings of each memory region from the wear leveling manager 88. Then, when writing or reading of data is performed on the memory region in which the number of rewritings is equal to or larger than a predetermined value, the access controller 52 may execute the first access process regardless of the set access method. When the first access process is executed, the access controller 52 does not perform writing having a high locality, and thus the number of rewritings does not locally increase. Therefore, the memory device 30 is able to averagely write data in the entire memory region in which the number of rewritings is equal to or larger than a predetermined value and increase a lifespan thereof.

Further, when the access method is determined for each region, the setter 56 may determine whether each region is a region in which a process of increasing the lifespan is performed or a region in which it is unnecessary to perform the process of increasing the lifespan. For example, the setter 56 may determine whether or not each region is a region in which the process of increasing the lifespan is performed on the basis of the number of rewritings of the region. Then, the setter 56 sets the first access process as the access method for the region in which the process of increasing the lifespan is performed. Accordingly, the memory device 30 is able to averagely write data in the whole region in which the process of increasing the lifespan is performed and increase the lifespan of the region.

While certain embodiments have been described, these embodiments have been presented by way of example only, and are not intended to limit the scope of the inventions. Indeed, the novel embodiments, described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

EXAMPLE 1

A memory device connected to one or more information processing devices, including:
 a shared memory; and
 a memory controller configured to:
  analyze an access to the shared memory by the one or more information processing devices and decide on an access method for accessing the shared memory by the one or more information processing devices; and
  give an instruction indicating the decided access method to the one or more information processing devices.

EXAMPLE 2

The memory device according to Example 1, further including an access controller configured to control writing of data and reading of cists on the shared memory in response to an access request for accessing the shared memory from the one or more information processing devices, wherein
 the memory controller sets the decided access method in the access controller, and
 the access controller performs writing of data or reading of data on the shared memory in accordance with the set access method.

EXAMPLE 3

The memory device according to Example 2, wherein each of the one or more information processing devices includes an individual memory, the memory controller decides that the access method is to be performed as a first access process of performing writing or reading of data transferred from the shared memory to the individual memory or a second access process of directly performing writing or reading of data stored in the shared memory, and each of the one or more information processing devices causes the access controller to transfer data from the shared memory to the individual memory and perform writing or reading of the data transferred to the individual memory when an instruction indicating the first access process is given, and transmits a request for writing or reading the data stored in the shared memory to the access controller when an instruction indicating the second access process is given.

EXAMPLE 4

The memory device according to Example 3, wherein the memory controller further decides on a usage capacity in the individual memory when the access method is decided to be the first access process, the memory controller further gives an instruction indicating the usage capacity to the one or more information processing devices, and each of the one or more information processing devices stores the data transferred from the shared memory in the corresponding individual memory within a range of the usage capacity indicated in the instruction.

EXAMPLE 5

The memory device according to Example 3 or 4, wherein the memory controller further decides on a saving method for saving data from the individual memory to the shared memory when the access method is decided to be the first access process, the memory controller further gives an instruction indicating the saving method to the one or more information processing devices, and each of the one or more information processing devices saves the data transferred from the shared memory from the corresponding individual memory to the shared memory in accordance with the saving method indicated in the instruction.

EXAMPLE 6

The memory device according to any one of Examples 3 to 5, wherein the shared memory further includes a first shared memory and a second shared memory having a faster response speed than the first shared memory, the memory controller further decides whether the second access process is to be performed as a low-speed process or a high-speed process when the access method is decided to be the second access process, and when the low-speed process is set as the access method, the access controller directly performs writing or reading of the data stored in the first shared memory in accordance with an access request according to the second access process transmitted from each of the one or more information processing devices, and when the high-speed process is set as the access method, the access controller directly per forms writing or reading of data that is transferred from the first shared memory to the second shared memory, in accordance with an access request according to the second access process, the access request being transmitted from each of the one or more information processing devices.

EXAMPLE 7

The memory device according to Example 6, wherein the memory controller gives an instruction indicating a degree of parallelism indicating the number of processes to be executed in parallel to the information processing device that transmits an access request according to the second access process, the memory controller further detects a sub region that is likely to be accessed in the first shared memory when deciding that the second access process is performed as the high-speed process, the access controller transfers data of the sub region in the first shared memory to the second shared memory in advance, and directly performs writing or reading of the data transferred to the second shared memory in advance in accordance with an access request according to the second access process for the sub region, the access request being transmitted from each of the one or more information processing devices, the access controller directly writing or reading on the first shared memory in accordance with an access request according to the second access process for a region different from the sub region, the access request being transmitted from each of the one or more information processing devices, and the memory controller gives an instruction indicating a first degree of parallelism to an information processing device that performs writing or reading of data on the second shared memory, and gives an instruction indicating a second degree of parallelism higher than the first degree of parallelism to an information processing device that performs writing or reading of data on the first shared memory.

EXAMPLE 8

The memory device according to any one of Examples 3 to wherein the memory controller gives an instruction indicating a degree of parallelism indicating the number of processes to be executed in parallel to the information processing device that transmits an access request according to the second access process, and the memory controller decides on the degree of parallelism in accordance with an access latency of a region in which data is written through the second access process.

EXAMPLE 9

The memory device according to Example 3, wherein the shared memory is divided into a plurality of regions, the memory controller analyzes access to each of the plurality of regions from the one or more information processing devices and decides on the access method for each of the plurality of regions, the memory controller sets the decided access method in the access controller for each of the plurality of regions, and gives an instruction indicating the decided access method to the one or more information processing devices, each of the one or more information processing devices accesses each of a plurality of regions in accordance with the instructed access method, and the access controller controls writing of data or reading of data on a corresponding region in accordance with the access method set for each of the plurality of regions.

EXAMPLE 10

The memory device according to Example 9, wherein the memory controller determines whether locality of access is higher than a predetermined value for each of the plurality of regions, decides that the access method for a first region in which the locality of the access is higher than the predetermined value is to be performed as the first access process, and decides that the access method for a second region in which the locality of the access is equal to or less than the predetermined value is to be performed as the second access process.

EXAMPLE 11

The memory device according to Example 10, wherein the shared memory further includes a first shared memory including at least some of the plurality of regions and a second shared memory having a faster response speed than the first shared memory, the memory controller decides whether the second region for which the access method is decided to be the second access process is set as a region on which the high-speed process is performed or a region on which the high-speed process is not performed, when an access request according to the second access process is received for the region on which the high-speed process is performed, the access controller directly performs writing or reading of the data that is transferred from the first shared memory to the second shared memory in advance, and when an access request according to the second access process is received for the region on which the high-speed process is not performed, the access controller directly performs writing or reading of the data stored in the first shared memory.

EXAMPLE 12

The memory device according to Example 11, wherein the memory controller decides to set the second region accessed from a predetermined number or more of information processing devices as the region in which a high-speed process is performed, and decides to set the second region accessed from information processing devices smaller in number than the predetermined number as the region in which a high-speed process is not performed.

EXAMPLE 13

The memory device according to any one of Examples 10 to 12, wherein
the memory controller determines whether the first region, for which the access method is decided to be the first access process is set as a power saving region or a non-power saving region, and the memory controller gives, to each of the one or more information processing devices, an instruction indicating a first value as a usage capacity for the corresponding individual memory for the power saving region, and gives, to each of the one or more information processing devices, an instruction indicating a second value larger than the first value as the usage capacity for the non-power saving region, each of the one or more information processing devices stores the data transferred from the shared memory in the corresponding individual memory within a range of the usage capacity for the first region for which the access method is the first access process as indicated in the instruction.

EXAMPLE 14

The memory device according to Example 13, wherein the memory controller decides to set the first region in which the number of accesses per unit time is equal to or less than a predetermined value as the power saving region, and decides to set the first region in which the number of accesses per unit time is larger than the predetermined value as the non-power saving region.

EXAMPLE 15

The memory device according to Example 13 or 14, wherein
the memory controller further decides a saving method for saving data from the individual memory to the shared memory for the first region for which the access method is decided to be the first access process, the memory controller further gives an instruction indicating the saving method for the first region to the one or more information processing devices, and each of the one or more information processing devices saves data transferred from the first region of the shared memory from the corresponding individual memory to the shared memory in accordance with the saving method indicated in the instruction.

EXAMPLE 16

The memory device according to any one of Examples 3 to 15, wherein
the memory controller is further configured to acquire a pattern of access to the shared memory from the one or more information processing devices and specify first data predicted to be accessed by the one or more information processing devices on the basis of the acquired pattern of access, wherein
when the first data is specified, the memory controller gives an instruction to acquire the first data in advance to an information processing device predicted to access the first data among the one or more information processing devices.

EXAMPLE 17

The memory device according to any one of Examples 3 to 15, wherein
the memory controller is further configured to acquire a pattern of access to the shared memory by the one or more information processing devices and specify second data predicted to be accessed by the one or more information processing devices on the basis of the acquired pattern of the access, wherein
when the second data is specified, the memory controller causes the access controller to transfer the second data to another memory having a response speed faster than a memory storing the second data.

EXAMPLE 18

The memory device according to any one of Examples 3 to 17, wherein the memory controller acquires a result of analyzing an execution operation of a program from the one or more information processing devices, and decides on the access method further on the basis of the acquired result.

EXAMPLE 19

The memory device according to any one of Examples 3 to 18, wherein the memory controller causes the one or more information processing devices to directly write or read the data stored in the shared memory during a predetermined measurement period after execution of a program is started in the one or more information processing devices, to analyze the access to the shared memory from the one or more information processing devices, and decides on the access method after the measurement period elapses.

EXAMPLE 20

The memory device according to Example 19, further including a history memory configured to store a history of the access method decided previously in association with a program being executed in the one or more information processing devices, wherein
when the history corresponding to the program executed in the one or more information processing devices is stored in the history memory, the memory controller decides on the access method on the basis of the history before the measurement period elapses.

EXAMPLE 21

The memory device according to any one of Examples 3 to 13, wherein
in a learning phase, the memory controller changes the access method while operating the one or more information processing devices, and trains a determination model for obtaining an optimal access method from operation information obtained as a result of executing an application program by the one or more information processing devices, and
in a usage phase, the memory controller operates the one or more information processing devices to acquire the operation information, and decides on the access method on the basis of the acquired operation information and the determination model.

EXAMPLE 22

The memory device according to Example 4, wherein
the memory controller determines whether a program being executed in two or more of the one or more information processing devices is able to be executed by a first information processing device which is one of the one or more information processing devices on the basis of the usage capacity indicated in the instruction for the one or more information processing devices, and
when the program is determined to be able to be executed, the memory controller gives an instruction indicating that a total amount of the usage capacities indicated in the instructions for the two or more information processing devices to the first information processing device is set as the usage capacity, gives, to the first information processing device, an instruction to start execution of the program being executed in the two or more information processing devices, and gives, to an information processing device that is not the first information processing device among the two or more information processing devices, an instruction to stop the execution of the program and enter a power saving state.

EXAMPLE 23

The memory device according to any one or Examples 3 to 22, wherein
the memory controller is further configured to manage a memory region in which the number of rewritings in the shared memory is equal to or larger than a predetermined value, wherein
when writing or reading of data is performed on the memory region in which the number of rewritings is equal to or larger than the predetermined value, the access controller performs the first access process regardless of the set access method.

EXAMPLE 24

A memory device connected to one or more information processing devices, including:
a shared memory having a plurality of regions; and
a memory controller configured to generate statistical information for memory access from access to each of the plurality of regions from the one or more information processing devices, analyze the generated statistical information, and acquire memory access information for each of the plurality of regions.

EXAMPLE 25

An information processing system including:
one or more information processing devices; and
a memory device connected to each of the one or more information processing devices via an interface, the memory device including a shared memory, wherein
the interface transfers operation statistical information of the one or more information processing devices from the one or more information processing devices to the memory device, and
the interface transfers information indicating an access method for accessing the shared memory by the one or more information processing devices from the memory device to the one or more information processing devices.

EXAMPLE 26

An information processing system, including:
one or more information processing devices; and
a memory device connected to the one or more information processing devices via a network, wherein
the memory device includes a shared memory, and
a memory controller configured to:
analyze an access to the shared memory from the one or more information processing devices and decide on an access method for accessing the shared memory by the one or more information processing devices, and
give an instruction indicating the decided access method to the one or more information processing devices.

EXAMPLE 27

A memory control method of controlling a memory device connected to one or more information processing devices, the memory device including a shared memory, the method including:
analyzing an access to the shared memory from the one or more information processing devices and deciding on an access method for accessing the shared memory by the one or more information processing devices; and
giving an instruction indicating the decided access method to the one or more information processing devices.

What is claimed is:

1. A memory device connected to one or more information processing devices, each of the one or more information processing devices including an individual memory, the memory device comprising:
a shared memory that includes a first shared memory and a second shared memory having a faster response speed than the first shared memory;
an access controller configured to control writing of data and reading of data on the shared memory in response to an access request for accessing the shared memory from the one or more information processing devices; and
a memory controller configured to:
analyze an access to the shared memory by the one or more information processing devices and decide on an access method for accessing the shared memory by the one or more information processing devices, the access method being to be performed as a first access process of performing writing or reading of data transferred from the shared memory to the individual memory or a second access process of directly performing writing or reading of data stored in the shared memory;
set the decided access method in the access controller; and
give an instruction indicating the decided access method to the one or more information processing devices, wherein
the access controller performs writing of data or reading of data on the shared memory in accordance with the set access method,
each of the one or more information processing devices causes the access controller to transfer data from the shared memory to the individual memory and perform writing or reading of the data transferred to the individual memory when an instruction indicating the first access process is given,
each of the one or more information processing devices transmits a request for writing or reading the data stored in the shared memory to the access controller when an instruction indicating the second access process is given,
the memory controller further decides on a usage capacity in the individual memory when the access method is decided to be the first access process,
the memory controller further gives an instruction indicating the usage capacity to the one or more information processing devices, and
the memory controller further decides whether the second access process is to be performed as a low-speed process or a high-speed process when the access method is decided to be the second access process, wherein
when the low-speed process is set as the access method, the access controller directly performs writing or reading of the data stored in the first shared memory in accordance with an access request according to the second access process transmitted from each of the one or more information processing devices, and
when the high-speed process is set as the access method, the access controller directly performs writing or reading of data that is transferred from the first shared memory to the second shared memory, in accordance with an access request according to the second access process, the access request being transmitted from each of the one or more information processing devices.

2. The memory device according to claim 1, wherein each of the one or more information processing devices stores the data transferred from the shared memory in the corresponding individual memory within a range of the usage capacity indicated in the instruction.

3. The memory device according to claim 1, wherein the memory controller further decides on a saving method for saving data from the individual memory to the shared memory when the access method is decided to be the first access process,
the memory controller further gives an instruction indicating the saving method to the one or more information processing devices, and
each of the one or more information processing devices saves the data transferred from the shared memory from the corresponding individual memory to the shared memory in accordance with the saving method indicated in the instruction.

4. The memory device according to claim 1, wherein the memory controller gives an instruction indicating a degree of parallelism indicating the number of processes to be executed in parallel to the information processing device that transmits an access request according to the second access process,
the memory controller further detects a sub region that is likely to be accessed in the first shared memory when deciding that the second access process is performed as the high-speed process,
the access controller transfers data of the sub region in the first shared memory to the second shared memory in advance, and directly performs writing or reading of the data transferred to the second shared memory in advance in accordance with an access request according to the second access process for the sub region, the access request being transmitted from each of the one or more information processing devices,
the access controller directly writing or reading on the first shared memory in accordance with an access request according to the second access process for a region different from the sub region, the access request being transmitted from each of the one or more information processing devices, and the memory controller gives an instruction indicating a first degree of parallelism to an information processing device that performs writing or reading of data on the second shared memory, and gives an instruction indicating a second degree of parallelism higher than the first degree of parallelism to an information processing device that performs writing or reading of data on the first shared memory.

5. The memory device according to claim 1, wherein the memory controller gives an instruction indicating a degree of parallelism indicating the number of processes to be executed in parallel to the information processing device that transmits an access request according to the second access process, and the memory controller decides on the degree of parallelism in accordance with an access latency of a region in which data is written through the second access process.

6. A memory device connected to one or more information processing devices, each of the one or more information processing devices including an individual memory, the memory device comprising:

a shared memory that is divided into a plurality of regions;

an access controller configured to control writing of data and reading of data on the shared memory in response to an access request for accessing the shared memory from the one or more information processing devices; and a memory controller configured to:
analyze an access to each of the plurality of regions by the one or more information processing devices and decides on an access method for accessing each of the plurality of regions by the one or more information processing devices, the access method being to be performed as a first access process of performing writing or reading of data transferred from each of the plurality of regions to the individual memory or a second access process of directly performing writing or reading of data stored in each of the plurality of regions;

set the decided access method in the access controller; and give an instruction indicating the decided access method to the one or more information processing devices for each of the plurality of regions, wherein the access controller performs writing of data or reading of data on a corresponding region in accordance with the access method set for each of the plurality of regions, each of the one or more information processing devices causes the access controller to transfer data from the corresponding region to the individual memory and performs writing or reading of the data transferred to the individual memory when an instruction indicating the first access process is given, each of the one or more information processing devices transmits a request for writing or reading the data stored in the corresponding region to the access controller when an instruction indicating the second access process is given, the memory controller further decides on a usage capacity in the individual memory when the access method is decided to be the first access process, and the memory controller further gives an instruction indicating the usage capacity to the one or more information processing devices.

7. The memory device according to claim 6, wherein the memory controller determines whether locality of access is higher than a predetermined value for each of the plurality of regions, decides that the access method for a first region in which the locality of the access is higher than the predetermined value is to be performed as the first access process, and decides that the access method for a second region in which the locality of the access is equal to or less than the predetermined value is to be performed as the second access process.

8. The memory device according to claim 7, wherein the shared memory further includes a first shared memory including at least some of the plurality of regions and a second shared memory having a faster response speed than the first shared memory, the memory controller decides whether the second region for which the access method is decided to be the second access process is set as a region on which the high-speed process is performed or a region on which the high-speed process is not performed, when an access request according to the second access process is received for the region on which the high-speed process is performed, the access controller directly performs writing or reading of the data that is transferred from the first shared memory to the second shared memory in advance, and when an access request according to the second access process is received for the region on which the high-speed process is not performed, the access controller directly performs writing or reading of the data stored in the first shared memory.

9. The memory device according to claim 7, wherein the memory controller determines whether the first region for which the access method is decided to be the first access process is set as a power saving region or a non-power saving region, and the memory controller gives, to each of the one or more information processing devices, an instruction indicating a first value as a usage capacity for the corresponding individual memory for the power saving region, and gives, to each of the one or more information processing devices, an instruction indicating a second value larger than the first value as the usage capacity for the non-power saving region, each of the one or more information processing devices stores the data transferred from the shared memory in the corresponding individual memory within a range of the usage capacity for the first region for which the access method is the first access process as indicated in the instruction.

10. The memory device according to claim 9, wherein the memory controller decides to set the first region in which the number of accesses per unit time is equal to or less than a predetermined value as the power saving region, and decides to set the first region in which the number of accesses per unit time is larger than the predetermined value as the non-power saving region.

11. The memory device according to claim 9, wherein the memory controller further decides a saving method for saving data from the individual memory to the shared memory for the first region for which the access method is decided to be the first access process, the memory controller further gives an instruction indicating the saving method for the first region to the one or more information processing devices, and each of the one or more information processing devices saves data transferred from the first region of the shared memory from the corresponding individual memory to the shared memory in accordance with the saving method indicated in the instruction.

12. A memory device connected to one or more information processing devices, each of the one or more information processing devices including an individual memory, the memory device comprising:
a shared memory;
an access controller configured to control writing of data and reading of data on the shared memory in response to an access request for accessing the shared memory from the one or more information processing devices; and
a memory controller configured to:
analyze an access to the shared memory by the one or more information processing devices and decide on an access method for accessing the shared memory by the one or more information processing devices, the access method being to be performed as a first access process of performing writing or reading of data transferred from the shared memory to the individual memory or a second access process of directly performing writing or reading of data stored in the shared memory;
set the decided access method in the access controller; and
give an instruction indicating the decided access method to the one or more information processing devices, wherein
the access controller performs writing of data or reading of data on the shared memory in accordance with the set access method,
each of the one or more information processing devices causes the access controller to transfer data from the shared memory to the individual memory and performs writing or reading of the data transferred to the individual memory when an instruction indicating the first access process is given,
each of the one or more information processing devices transmits a request for writing or reading the data stored in the shared memory to the access controller when an instruction indicating the second access process is given,
the memory controller further decides on a usage capacity in the individual memory when the access method is decided to be the first access process,
the memory controller further gives an instruction indicating the usage capacity to the one or more information processing devices, and
the memory controller is further configured to acquire a pattern of access to the shared memory from the one or more information processing devices and specify first data predicted to be accessed by the one or more information processing devices on the basis of the acquired pattern of access, wherein
when the first data is specified, the memory controller gives an instruction to acquire the first data in advance to an information processing device predicted to access the first data among the one or more information processing devices.

\* \* \* \* \*